(12) United States Patent
Makino

(10) Patent No.: US 7,164,306 B2
(45) Date of Patent: Jan. 16, 2007

(54) COMPOSITE MULTIPLEXER CIRCUIT AND CHIP COMPONENT, HIGH-FREQUENCY MODULE AND RADIO COMMUNICATION APPARATUS USING THE SAME

(75) Inventor: Yutaka Makino, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 154 days.

(21) Appl. No.: 10/965,277

(22) Filed: Oct. 14, 2004

(65) Prior Publication Data

US 2005/0281210 A1    Dec. 22, 2005

(30) Foreign Application Priority Data

| Oct. 16, 2003 | (JP) | ............................. 2003-356949 |
| Nov. 26, 2003 | (JP) | ............................. 2003-396136 |
| Aug. 31, 2004 | (JP) | ............................. 2004-253370 |
| Sep. 16, 2004 | (JP) | ............................. 2004-270203 |

(51) Int. Cl.
*H03K 17/62* (2006.01)

(52) U.S. Cl. ....................................... 327/407; 333/133

(58) Field of Classification Search ...................... None
See application file for complete search history.

(56) References Cited

U.S. PATENT DOCUMENTS 5,559,481 A * 9/1996 Satoh et al. ................. 333/193
6,489,860 B1 * 12/2002 Ohashi ......................... 333/133
6,683,512 B1    1/2004 Nakamata et al. ........... 331/126
6,766,149 B1 * 7/2004 Hikita et al. .................... 455/83
6,927,648 B1 * 8/2005 Furuya et al. ................. 333/132
2003/0030514 A1 * 2/2003 Suma et al. .................. 333/206
2004/0132487 A1 * 7/2004 Kearns ....................... 455/552.1

FOREIGN PATENT DOCUMENTS

| EP | 0 921 642 | 6/1999 |
| EP | 1 315 305 | 5/2003 |
| EP | 1 418 679 | 5/2004 |
| EP | 1 443 666 | 8/2004 |
| JP | 11-225088 | 8/1999 |
| JP | 2003-8469 | 1/2003 |

* cited by examiner

*Primary Examiner*—Timothy P. Callahan
*Assistant Examiner*—Cassandra Cox
(74) *Attorney, Agent, or Firm*—Hogan & Hartson LLP

(57) ABSTRACT

In a composite multiplexer circuit designed to multiplex plural frequency bands by interconnecting plural multiplexer circuits in parallel, a multiplexer circuit for extracting a frequency band of a GPS reception system includes a matching network including an inductor and a capacitor, and a surface acoustic wave filter connected in series with the matching network. The multiplexer circuit for the GPS reception system can be so set as to have infinite impedances at the other frequency bands than the frequency band thereof. This prevents signals in the other frequency bands from leaking into the multiplexer circuit for the GPS reception system.

16 Claims, 20 Drawing Sheets

COMPOSITE MULTIPLEXER CIRCUIT AND CHIP COMPONENT, HIGH-FREQUENCY MODULE AND RADIO COMMUNICATION APPARATUS USING THE SAME

BACKGROUND OF THE INVENTION

1. Field of the Invention

The present invention relates to a composite multiplexer circuit capable of multiplexing high-frequency signals in plural different frequency bands, and to a chip component, high-frequency module and radio communication apparatus using the same.

2. Description of the Related Art

Portable telephones have been spreading wider and wider in recent years, while the function of the portable telephones and the services associated therewith have been improved.

A multiband portable telephone has been proposed as a novel portable telephone. In contrast to the conventional portable telephones handling only one transmission/reception system, the multiband portable telephone is adapted to handle a plurality of transmission/reception systems. This permits a user to selectively use any one of the transmission/reception systems that is suited for a service area or usage purpose.

In another practice, a reception system having a novel frequency band (1500 MHz-band) such as of the GPS (Global Positioning System) for positional detection has been added to the portable telephones.

By way of example, a brief description is made on the configurations of a portable telephone based on Cellular (800 MHz-band)/GPS systems and of a portable telephone based on PCS (Personal Communication Services: 1900 MHz-band)/GPS systems.

In addition, a brief description is also made on the configuration of a portable telephone based on Cellular/GPS/PCS systems which is adapted to switch to any one of the three transmission/reception systems of Cellular/GPS/PCS.

First, the Cellular/GPS portable telephone is provided with an antenna multiplexer which multiplexes complex signals of two Cellular/GPS transmission/reception systems having different pass bands by means of respective multiplexer circuits each allowing the passage of a high-frequency signal in a predetermined frequency band, and which switches the Cellular transmission/reception system between its transmission system Tx and its reception system Rx. The telephone further includes a power amplifier constituting the Cellular transmission system Tx, a low noise amplifier constituting the Cellular reception system Rx, a low noise amplifier constituting a GPS reception system Rx and the like.

On the other hand, the PCS/GPS portable telephone is provided with an antenna multiplexer which multiplexes complex signals of two PCS/GPS transmission/reception systems having different pass bands by means of respective multiplexer circuits each allowing the passage of a high-frequency signal in a predetermined frequency band, and which switches the PCS transmission/reception system between its transmission system Tx and its reception system Rx. The telephone further includes a power amplifier constituting the PCS transmission system Tx, a low noise amplifier constituting the PCS reception system Rx, a low noise amplifier constituting a GPS reception system Rx and the like.

Furthermore, the Cellular/GPS/PCS portable telephone is provided with an antenna multiplexer which multiplexes complex signals of three Cellular/GPS/PCS transmission/reception systems having different pass bands by means of respective multiplexer circuits each allowing the passage of a high-frequency signal in a predetermined frequency band, and which switches the Cellular transmission/reception system between its transmission system Tx and its reception system Rx and also switches the PCS transmission/reception system between its transmission system Tx and its reception system Rx. The telephone further includes a power amplifier constituting the Cellular transmission system Tx, a low noise amplifier constituting the Cellular reception system Rx, a power amplifier constituting the PCS transmission system Tx, a low noise amplifier constituting the PCS reception system Rx, a low noise amplifier constituting a GPS reception system Rx and the like.

In the GPS reception system Rx thus multiplexed by the aforesaid composite multiplexer circuit, a SAW (Surface Acoustic Wave) filter having a sharp pass characteristic is employed for exclusively allowing the passage of a reception high-frequency signal at GPS frequencies.

In this case, it is desirable that the multiplexer circuit of the GPS reception system Rx has infinite input impedances in the other frequency bands such as of the Cellular and PCS systems as viewed from an antenna terminal of the composite multiplexer circuit. In actual fact, however, the input impedances in these frequency bands are significantly low.

FIG. 34 is an impedance chart where the center C of the circle represents a characteristic impedance of 50 Ω. A solid dot R represents an input impedance of a single SAW filter as determined at a Cellular frequency band of 800 MHz which is lower than the GPS frequency band of interest. A real part of the impedance at the point R on the coordinate circle substantially has a value of 0, whereas an imaginary part thereof has a value of about −0.5. Hence, an absolute value of the impedance is roughly a half of 50 Ω or about 25 Ω. The value of 25 Ω is so small that the composite multiplexer circuit detrimentally multiplexes the high-frequency signals although it is desired to inhibit the high-frequency signals from entering the multiplexer circuit of the GPS reception system Rx. Consequently, the high-frequency signal to flow through the Cellular multiplexer circuit is decreased in power.

The aforementioned short absolute value of the impedance may also be encountered in another higher frequency band such as the PCS frequency band of 1900 MHz.

It is therefore an object of the invention to provide a composite multiplexer circuit comprising a plurality of multiplexer circuits connected in parallel thereby attaining an ability to multiplex a plurality of frequency bands, the composite circuit capable of positively preventing each of the multiplexer circuits from encountering invading signals in the other frequency band(s) than the band thereof, and of avoiding the increase of transmission losses in the individual frequency bands.

It is another object of the invention to provide a chip component, a high-frequency module and a radio communication apparatus which employ the aforementioned composite multiplexer circuit for achieving low transmission losses and high reliability.

BRIEF SUMMARY OF THE INVENTION

According to the invention, a composite multiplexer circuit comprises a plurality of multiplexer circuits connected in parallel thereby attaining an ability to multiplex a plurality of frequency bands, and is characterized in that at least one multiplexer circuit for extracting one frequency band comprises a matching network including an inductor and a capacitor, and a surface acoustic wave filter connected in series with the matching network.

According to the configuration, the aforesaid multiplexer circuit for extracting one frequency band comprises the matching network and the surface acoustic wave filter connected in series with the matching network and may be set to have infinite impedance at the other frequency band than a frequency band thereof by selecting a constant for the matching network. This inhibits interference with the other multiplexer circuit for extracting a high-frequency signal in the other frequency band, thereby preventing the leakage of electric power.

This composite multiplexer circuit may preferably establish a relation that the total sum of real parts of admittances in the individual frequency bands of all the multiplexer circuits, as viewed from a junction point connected with an antenna terminal, is 1 whereas the total sum of imaginary parts of the admittances thereof is 0, the admittances normalized by a characteristic admittance. So long as this relation is satisfied, there may be provided the composite multiplexer circuit which is adapted to meet plural frequency bands and suffers less transmission loss in any of the frequency bands.

The number of the plural frequency bands may be 2, for example, (referred to as a first and a second frequency band). In this case, the multiplexer circuit of either one of the frequency bands may comprise the matching network and the surface acoustic wave filter.

Alternatively, the number of the plural frequency bands may also be 3, for example, (referred to as a first, a second and a third frequency band in this order). In this case, the multiplexer circuit of the second frequency band may preferably comprise the matching network and the surface acoustic wave filter. The reason is that a band pass filter, which can capitalize on a sharp attenuation characteristic of the surface acoustic wave filter, is suited for the multiplexer circuit of the second frequency band.

A specific example of the matching network may employ a circuit comprising a series capacitor, a parallel capacitor, a series inductor and a parallel capacitor, which are arranged from an input side in the order named.

The series inductor of the matching network may preferably have an Inductance L of 15 nH or less, and a Q-value (hereinafter referred to as "Q") of 15 or more as determined at 800 MHz. By limiting the Inductance L and the Q to the above ranges, the multiplexer circuit of interest can be decreased in the transmission loss at the pass frequency thereof while maintaining the infinite impedances at the other frequencies.

The SAW filter may be of a Balance output type or an Unbalance output type. In the case of the Balance output type, the SAW filter may be adapted for a case where an IC connected rearwardly thereof is of a Balance input type (the Balance input type is more advantageous from the standpoint of noises).

According to another aspect of the invention, a composite multiplexer circuit comprises a plurality of multiplexer circuits connected in parallel thereby attaining an ability to multiplex a plurality of frequency bands, and is characterized in that at least one multiplexer circuit for extracting one frequency band comprises a high pass filter including an inductor and a capacitor, and a band elimination filter.

According to this configuration, there may be provided the composite multiplexer circuit which is adapted to meet plural frequency bands and always connectable. The composite multiplexer circuit can be formed without using a switching device such as a diode and besides, does not suffer increased transmission losses. In a case where a SAW filter is connected rearwardly of the composite multiplexer circuit, the composite circuit is capable of reducing static electricity affecting the SAW filter and suppressing harmonic distortion, and does not require an increased number of components.

It is desirable that the composite multiplexer circuit establishes a relation that the total sum of real parts of admittances in the individual frequency bands of all the multiplexer circuits, as viewed from a junction point connected with an antenna terminal, is 1 whereas the total sum of imaginary parts of the admittances thereof is 0, the admittances normalized by a characteristic admittance. So long as the relation is satisfied, there may be provided the composite multiplexer circuit which is adapted to meet plural frequency bands and suffers less transmission loss in any of the frequency bands.

The number of the plural frequency bands may be 3, for example, (referred to as a first, a second and a third frequency band).

The composite multiplexer circuit may have a configuration wherein the multiplexer circuit of the first frequency band comprises at least one low pass filter; the multiplexer circuit of the second frequency band comprises a high pass filter and a band elimination filter; and the multiplexer circuit of the third frequency band comprises a high pass filter and a matching inductor.

In an alternative configuration, the multiplexer circuit of the first frequency band may comprise at least one low pass filter; the multiplexer circuit of the second frequency band may comprise a high pass filter, a band elimination filter and a matching inductor; and the multiplexer circuit of the third frequency band may comprise a high pass filter.

A chip component according to the invention comprises a dielectric multilayered substrate mounting thereon the individual component circuits of the aforementioned composite multiplexer circuit. This provides for the implementation of a compact, thin composite multiplexer circuit.

According to the invention, a compact high-frequency module having an excellent electrical transmission performance may be provided, which comprises the aforementioned composite multiplexer circuit mounted on a surface of and/or internally of a dielectric multilayered substrate, and which mounts thereon either one or both of a duplexer and a power amplifier.

Furthermore, there may be provided a radio communication apparatus which comprises the aforesaid high-frequency module so as to be adapted to meet plural frequency bands.

Furthermore, the composite multiplexer circuit according to the invention may be formed within a multilayered substrate so that the composite multiplexer circuit may be incorporated in a multilayered circuit board of a composite high-frequency module as unified with a chip component. This provides for the implementation of a compact, thin composite multiplexer circuit.

Such a composite multiplexer circuit may be applied to radio communication apparatuses adapted to meet plural frequency bands, which include composite mobile communication terminals, mobile communication apparatuses and the like.

DETAILED DESCRIPTION OF THE INVENTION

Preferred embodiments of the invention will hereinbelow be described in details with reference to the accompanying drawings.

Figure 1:
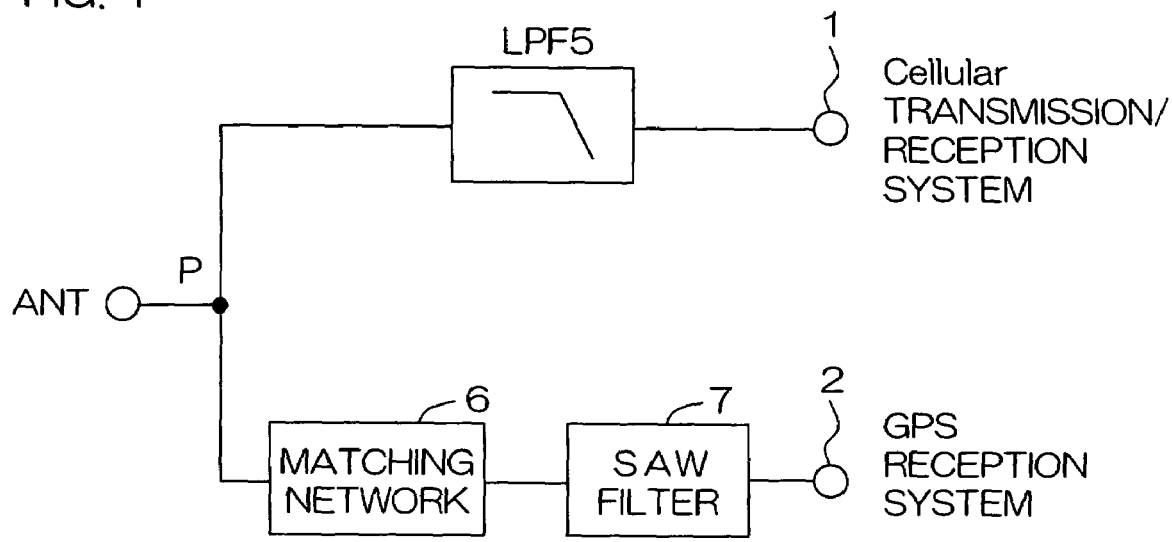
FIG. 1 is a block diagram showing a composite multiplexer circuit according to the invention.
Figure 2:
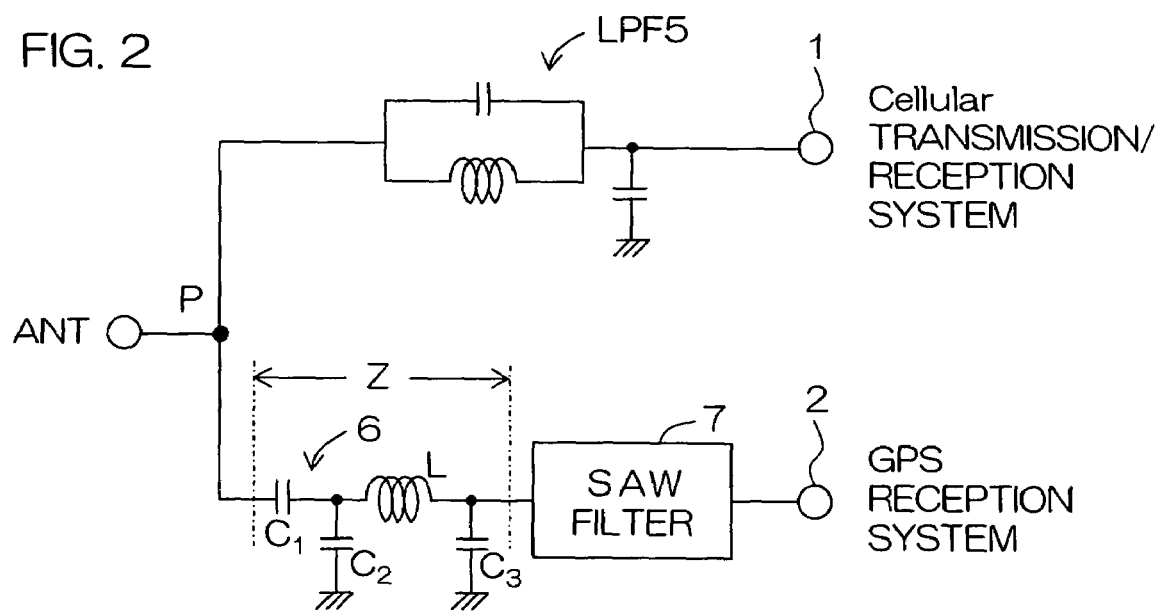
FIG. 2 is a circuit diagram of the above composite multiplexer circuit.

FIG. 1 is a block diagram showing a composite multiplexer circuit according to the invention. FIG. 2 is a circuit diagram of the above composite multiplexer circuit.

The composite multiplexer circuit has a dual band configuration corresponding to two communication systems which include, for example, the Cellular communication system (a first frequency band: 800 MHz) and the GPS communication system (a second frequency band: 1500 MHz).

The composite multiplexer circuit includes: an ANT terminal connected with an antenna; a first terminal 1 for input/output of high-frequency signals in the first frequency band; and a second terminal 2 for input of a high-frequency signal in the second frequency band.

A low-pass filter circuit (hereinafter referred to as "LPF") 5 is connected between the ANT terminal and the first terminal 1. As shown in FIG. 2, the LPF 5 is an LC filter wherein an inductor and a capacitor are connected in parallel.

As will be described hereinlater, the LPF 5 is constituted by strip lines and the capacitor formed at some of the individual layers of a multilayered substrate.

The LPF 5 is designed to attenuate the second frequency band. While the first frequency band of the Cellular communication system contains higher harmonics such as a doubled frequency wave and a tripled frequency wave, the LPF is also adapted to attenuate such higher harmonics.

On the other hand, a matching network 6 including an inductor and a capacitor, and a SAW (Surface Acoustic Wave) filter 7 are connected in series between the ANT terminal and the second terminal 2. As shown in FIG. 2, the matching network 6 comprises an inductor L and a capacitor C1 which are inserted in series; and capacitors C2, C3 each interconnecting either one of the opposite ends of the inductor L and the ground.

The matching network 6 comprises strip lines formed at some of the individual layers of the multilayered substrate, and a capacitor utilizing an interlayer capacitance. However, the matching network may also employ a chip component of the inductor or the capacitor, instead of the strip lines or the capacitor formed within the multilayered substrate.

While the configuration of the SAW filter is not limited, a preferred configuration may be made such that comb-like IDT (Inter-Digital Transducer) electrodes are formed on a substrate such as of $LiTaO_3$ crystal of 36° Y-cut and X-propagation, $LiNbO_3$ crystal of 64° Y-cut and X-propagation, and $LiB_4O_7$ crystal of 45° X-cut and Z-propagation.

The aforesaid SAW filter may be a SAW filter which is supplied with an unbalanced high-frequency signal for outputting a balanced high-frequency signal. Conversely, the SAW filter may be a SAW filter which is supplied with an unbalanced high-frequency signal for outputting an unbalanced signal.

The aforesaid matching network 6 is a circuit necessary for increasing an impedance in the first frequency band of the Cellular communication system between the ANT terminal and the second terminal 2 thereby causing the most high-frequency signals to flow from the ANT terminal to the first terminal 1.

In FIG. 2, "Z" represents the impedance of the matching network 6 as a single unit. As described in the context of "DESCRIPTION OF THE RELATED ART", the SAW filter 7 alone provides such a low impedance in the first frequency band of the Cellular communication system that the SAW filter allows the high-frequency signal to the Cellular communication system to flow from the ANT terminal to the second terminal 2. Hence, the matching network 6 is added such as to rotate the phase of the impedance in conjunction with the decrease of the frequency, while maintaining the second frequency band of the GPS in a matched state (as will be described hereinlater). Thus, the impedance in the first frequency band between the ANT terminal and the second terminal 2 can be increased, so that the high-frequency signal to the Cellular communication system is prevented from leaking to the second terminal 2.

Thus, the combination of the matching network 6 including the inductor and the capacitor, and the SAW filter 7 are designed to attenuate the high-frequency signal in the frequency band of the Cellular communication system.

Respective admittances in the first frequency band (800 MHz) and the second frequency band (1500 MHz) in a multiplexer circuit for the Cellular transmission/reception system are expressed as follows, the multiplexer circuit viewed from a junction point P where the composite multiplexer circuit is divided into two branches:

$Y1a=G1a+jB1a,$ $Y2a=G2a+jB2a.$

Figure 3:
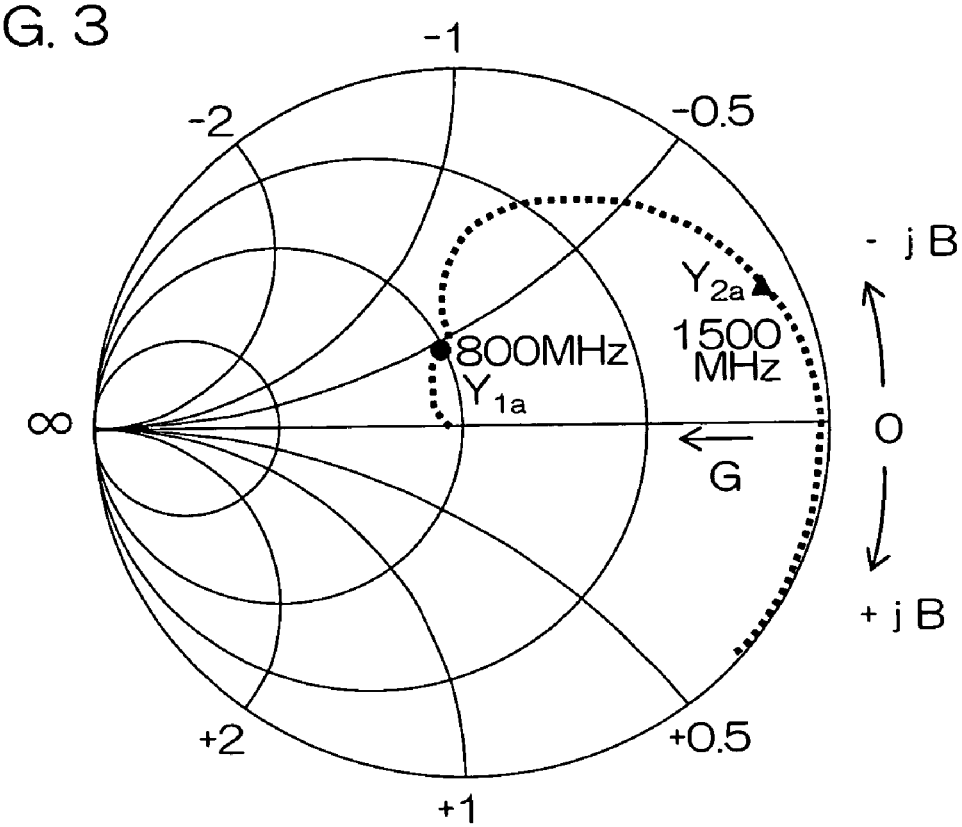
FIG. 3 is an admittance chart showing admittances in a Cellular transmission/reception multiplexer circuit of a composite multiplexer circuit as viewed from a junction point P.

The positional relation between these admittances is shown in an admittance chart of FIG. 3.

Furthermore, respective admittances in the first frequency band (800 MHz) and the second frequency band (1500 MHz) in a multiplexer circuit for the GPS reception system are expressed as follows, the multiplexer circuit viewed from the junction point P:

$Y1b=G1b+jB1b,$ $Y2b=G2b+jB2b.$

Figure 4:
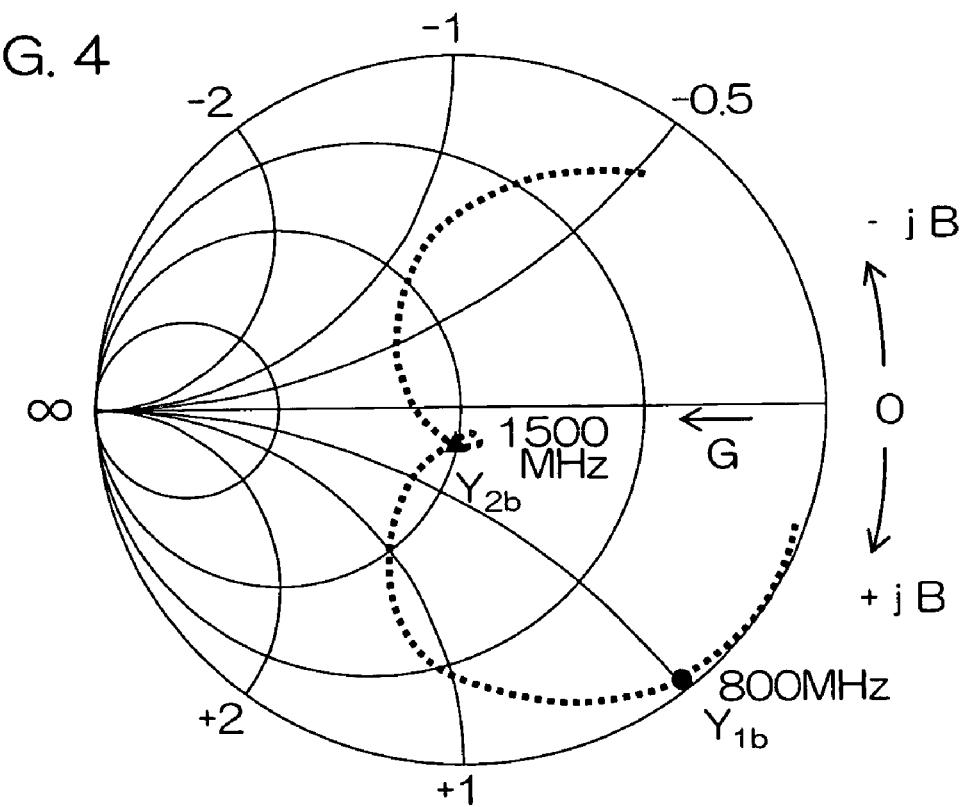
FIG. 4 is an admittance chart showing admittances in a GPS reception multiplexer circuit of the composite multiplexer circuit as viewed from the junction point P.

The positional relation between these admittances is shown in an admittance chart of FIG. 4.

It is possible to obtain a composite multiplexer circuit featuring good multiplexing and matching performances if the matching conditions of the composite multiplexer circuit are so designed as to satisfy the following expressions (1):

$Gna+Gnb=1$ $Bna+Bnb=0(n=1, 2)$ (1)

where "n" represents a numeral indicating a frequency band; "n=1" means the first frequency band (800 MHz); and "n=2" means the second frequency band (1500 MHz). It is noted that the value "1" of the above expression (Gna+Gnb) is normalized by a characteristic admittance Y0(Y0 defined to be 0.02S, for example).

Figure 5:
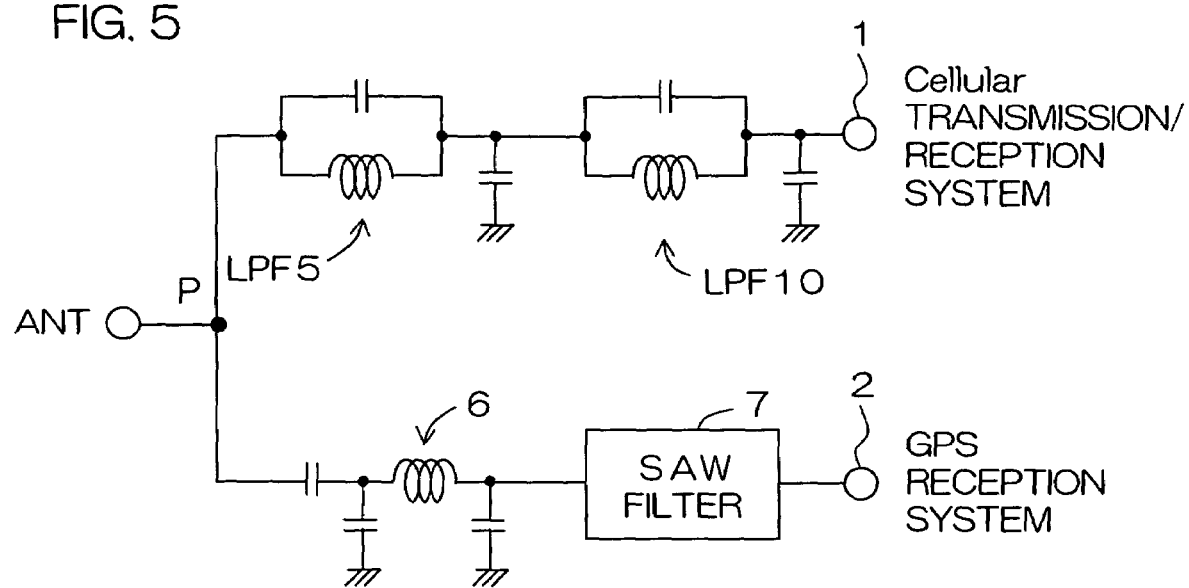
FIG. 5 shows a circuit equivalent to the composite multiplexer circuit, the equivalent circuit which is one level increased in higher-harmonic reducing function but maintains the multiplexing function of the composite multiplexer circuit as it is.

Next, FIG. 5 shows an exemplary configuration of a composite multiplexer circuit which is one level increased in higher-harmonic reducing function but maintains a multiplexing function of the composite multiplexer circuit as it is, the latter composite multiplexer circuit described with reference to FIG. 1 through FIG. 4.

The composite multiplexer circuit of FIG. 5 has the configuration wherein another series LPF 10 is added to the LPF 5 of the multiplexer circuit of the composite multiplexer circuit of FIG. 2, the multiplexer circuit responsible for extracting the high-frequency signal to the Cellular transmission/reception system.

The low pas filter may be constructed in a two stage configuration by adding the LPF 10, thereby achieving an even higher ability to reduce the higher harmonics, such as the doubled frequency wave and the tripled frequency wave, in the first frequency band of the Cellular transmission/reception system.

Figure 6:
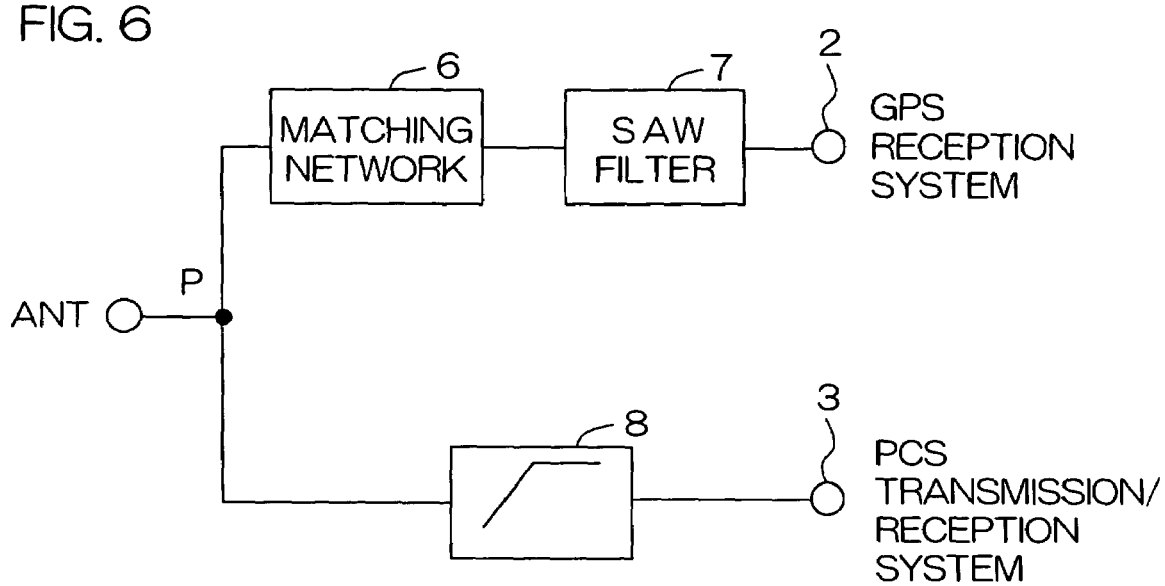
FIG. 6 is a block diagram showing a composite multiplexer circuit according to another circuit configuration of the invention.
Figure 7:
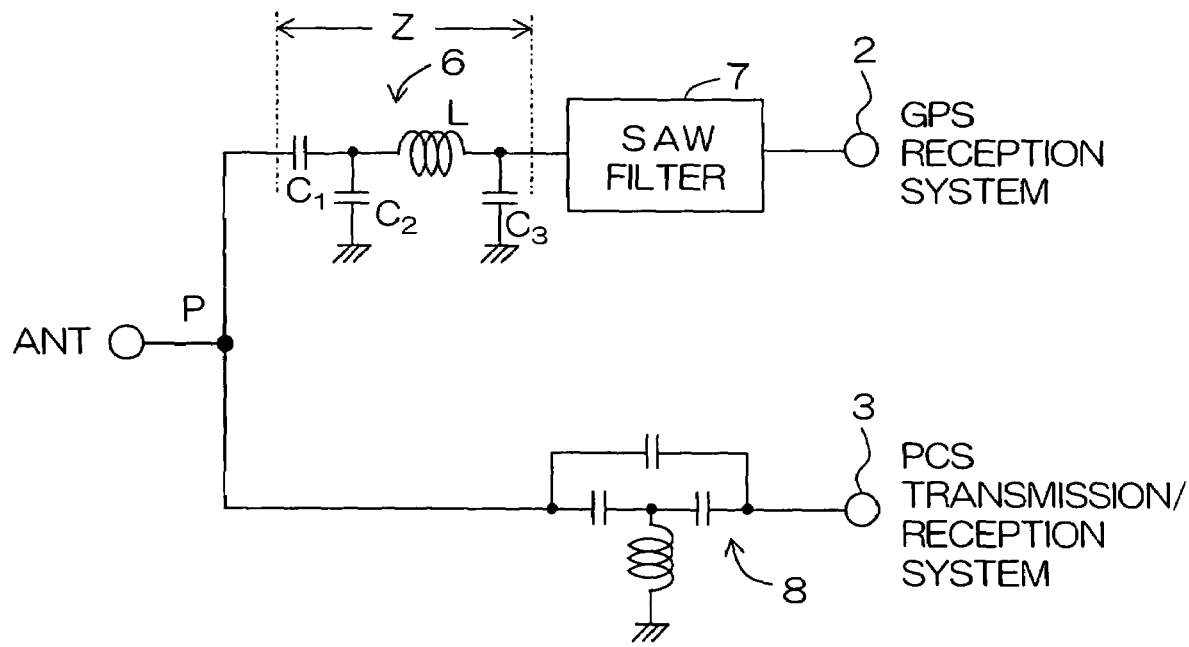
FIG. 7 is a circuit diagram of the above composite multiplexer circuit.

FIG. 6 is a block diagram showing another composite multiplexer circuit according to the invention, whereas FIG. 7 is a circuit diagram of the above composite multiplexer circuit.

This composite multiplexer circuit corresponds to two communication systems which include, for example, the GPS communication system (the second frequency band: 1500 MHz) and a PCS communication system (a third frequency band: 1900 MHz).

The composite multiplexer circuit includes: the ANT terminal connected with the antenna; the second terminal 2 for outputting the reception high-frequency signal in the second frequency band; and a third terminal 3 for input/output of transmission/reception high-frequency signals in the third frequency band.

The matching network 6 including the inductor and the capacitors, and the SAW filter 7 are inserted between the ANT terminal and the second terminal 2. As shown in FIG. 7, the matching network 6 has a configuration wherein a series capacitor is connected with the ANT terminal while the series capacitor, a parallel capacitor, a series inductor and a parallel capacitor are interconnected in the order named.

On the other hand, a high pass filter (hereinafter, referred to as "HPF") 8 is connected between the ANT terminal and the third terminal 3 for the PCS communication system.

The HPF 8 is designed to attenuate the second frequency band of the GPS communication system. While the frequency band of the PCS communication system contains the higher harmonics such as the doubled frequency wave and the tripled frequency wave, the HPF 8 and the parallel inductor 9 are also capable of attenuating these higher harmonics.

The matching network 6 comprises strip lines formed at some of the individual layers of the multilayered substrate, and a capacitor utilizing an interlayer capacitance. However, the matching network may also employ a chip component of the inductor or capacitor instead of the strip lines or the capacitor formed within the multilayered substrate.

The HPF 8 also comprises strip lines formed within the multilayered substrate and a capacitor utilizing an interlayer capacitance. Alternatively, the HPF may also employ a chip component of the inductor or capacitor, instead of the strip lines or the capacitor formed within the multilayered substrate.

In FIG. 7, "Z" represents the impedance of the matching network 6 as a single unit. As described in the context of "DESCRIPTION OF THE RELATED ART", the SAW filter 7 alone provides such a low impedance in the third frequency band of the PCS communication system that the SAW filter allows the high-frequency signal to the PCS communication system to leak from the ANT terminal to the second terminal 2. Hence, the matching network 6 is added thereby to rotate the phase of the impedance in conjunction with the increase of the frequency, while maintaining the second frequency band of the GPS in the matched state. Thus, the impedance in the third frequency band between the ANT terminal and the second terminal 2 can be increased.

Respective admittances in the second frequency band (1500 MHz) and the third frequency band (1900 MHz) in the GPS reception system are expressed as follows, the GPS reception system viewed from a junction point P where the composite multiplexer circuit is divided into two branches:

$Y2c = G2c + jB2c,$ $Y3c = G3c + jB3c.$

Figure 8:
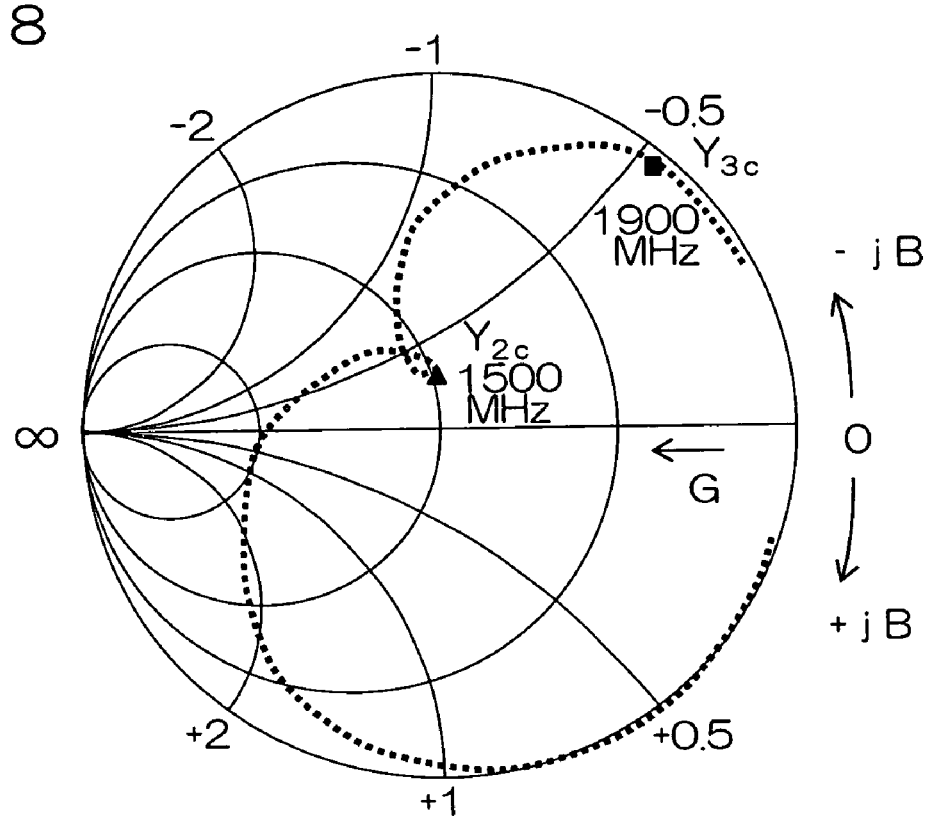
FIG. 8 is an admittance chart showing admittances in a GPS reception system of the composite multiplexer circuit as viewed from a junction point P.

The positional relation between these admittances is shown in an admittance chart of FIG. 8.

Respective admittances in the second frequency band (1500 MHz) and the third frequency band (1900 MHz) in the PCS transmission/reception system are expressed as follows, the PCS transmission/reception system viewed from the junction point P:

$Y2d = G2d + jB2d,$ $Y3d = G3d + jB3d.$

Figure 9:
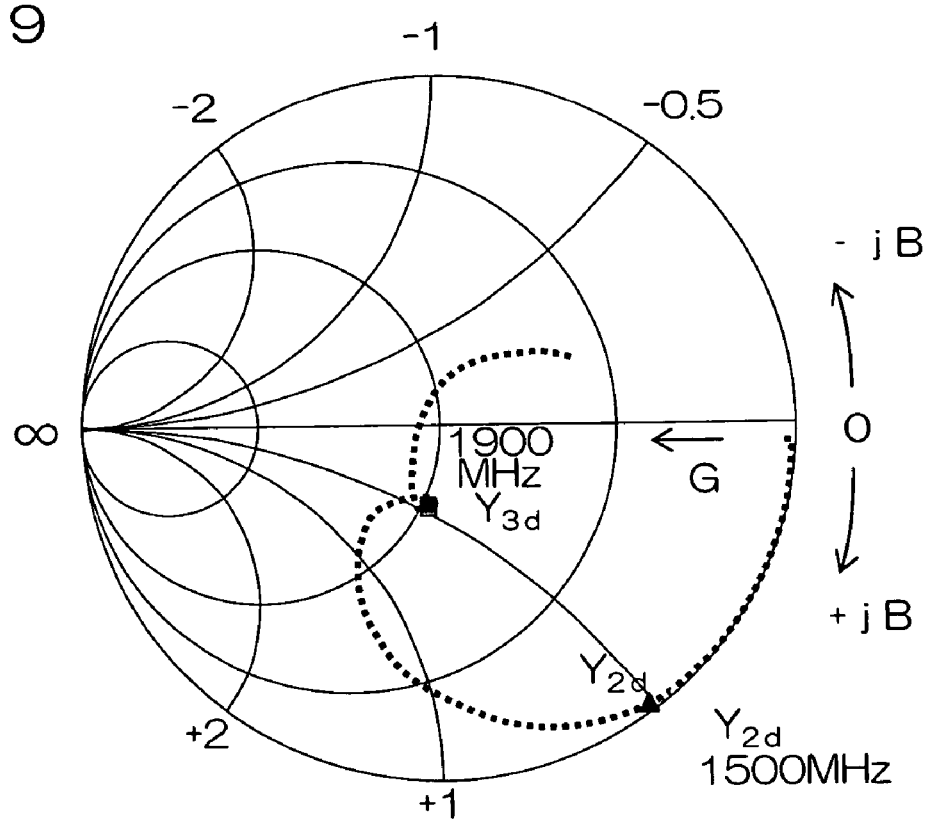
FIG. 9 is an admittance chart showing admittances in a PCS transmission/reception system of the composite multiplexer circuit as viewed from the junction point P.

The positional relation between these admittances is shown in an admittance chart of FIG. 9.

It is possible to obtain a composite multiplexer circuit featuring good multiplexing and matching performances if the matching conditions in the composite multiplexer circuit are so designed as to satisfy the following expressions (2):

$Gnc + Gnd = 1$ $Bnc + Bnd = 0 (n = 2, 3)$ (2)

where "n" represents a numeral indicating a frequency band; "n=2" means the second frequency band (1500 MHz); and "n=3" means the third frequency band (1900 MHz). It is noted that the value "1" of the above expression (Gnc+Gnd) is normalized by the characteristic admittance Y0 (Y0 defined to be 0.02S, for example).

Next, exemplary numerical values of the individual components of the matching network 6 are explained as below.

The series inductor L constituting the matching network 6 may preferably employ an inductor which has an inductance of 15 nH or less and has a Q of 15 or more as determined at 800 MHz. It is noted, however, that the value of the series capacitor C1 is set to 1.0 pF; the value of the parallel capacitor C2 is set to 0.25 pF; and the value of the parallel capacitor C3 is set to 2.4 pF.

Figure 10:
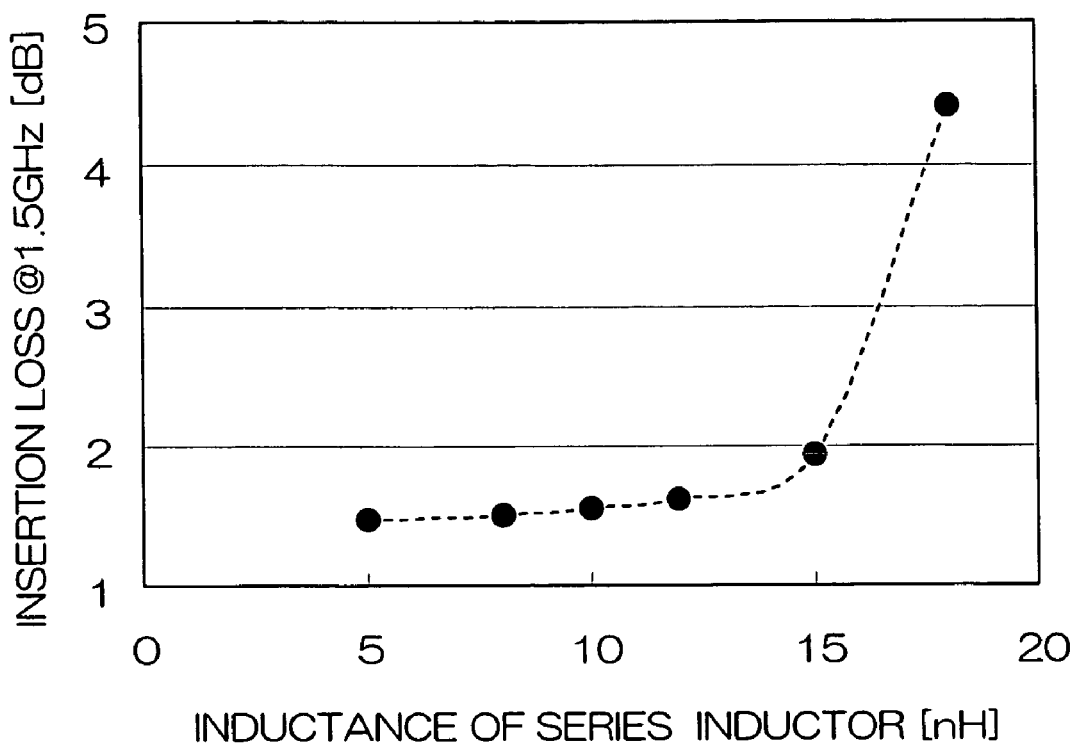
FIG. 10 is a graphical representation of a relation between the inductance value of a series inductor L of a matching network 6 and the insertion loss in a second frequency band.

A relation between the inductance of the series inductor L and the insertion loss between the ANT terminal at 1.5 GHz and the second terminal 2 is shown in FIG. 10.

Figure 11:
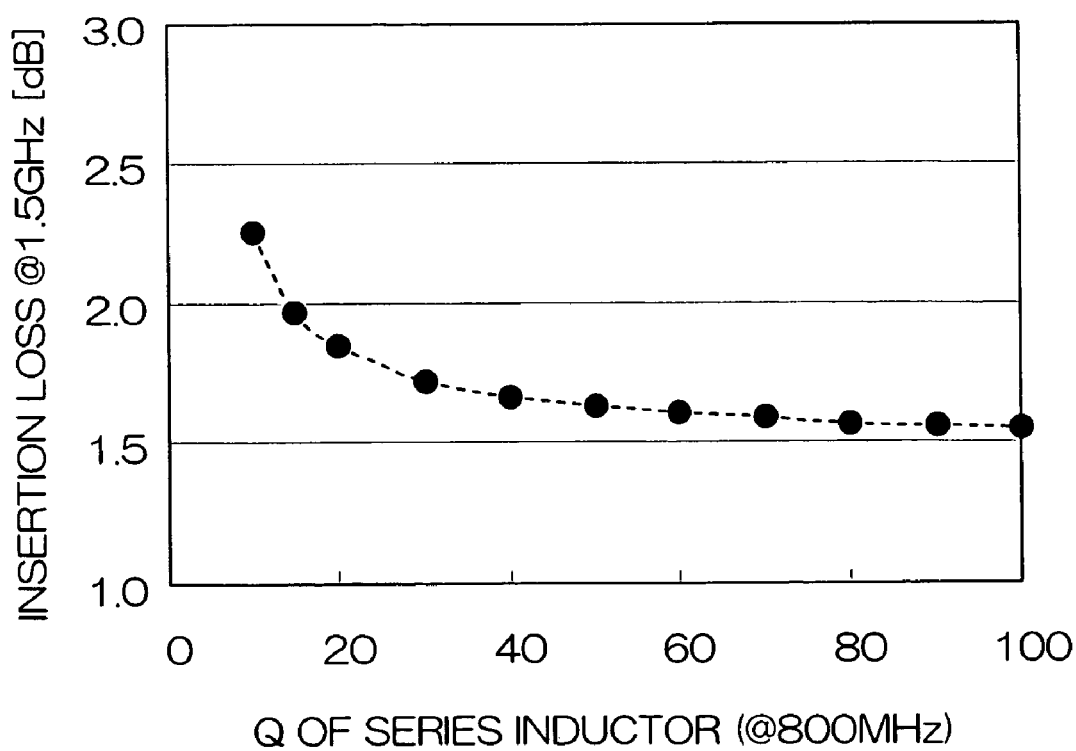
FIG. 11 a graphical representation of a relation between the Q of the series inductor L of the matching network 6 and the insertion loss in the second frequency band.

In addition, a relation between the aforesaid Q and the insertion loss between the ANT terminal at 1.5 GHz of the GPS reception system and the second terminal 2 is shown in FIG. 11.

FIG. 10 shows the inductance of the series inductor L on the abscissa, and the insertion loss at 1.5 GHz on the ordinate. The graph indicates the relation that as the inductance is increased, the insertion loss is correspondingly increased. Assuming that the insertion loss shown in FIG. 10 is controlled to 2.0 dB or less, it is understood that the inductance of the series inductor L is best defined to be 15 nH or less.

FIG. 11 shows the Q of the series inductor L on the abscissa, and the insertion loss at 1.5 GHz on the ordinate. The graph indicates the relation that as the Q is increased, the insertion loss is correspondingly decreased. Assuming that the insertion loss at 1.5 GHz shown in FIG. 11 is controlled to 2.0 dB or less, it is understood that the Q of the series inductor L is best defined to be 15 or more.

As described above, the design is made such that the inductor and capacitor for the matching purpose cooperate with the SAW filter 7 to decrease the passage loss in the GPS reception system between the ANT terminal and the second terminal 2, and to attenuate the high-frequency signal in the frequency band of the PCS communication system.

Figure 12:
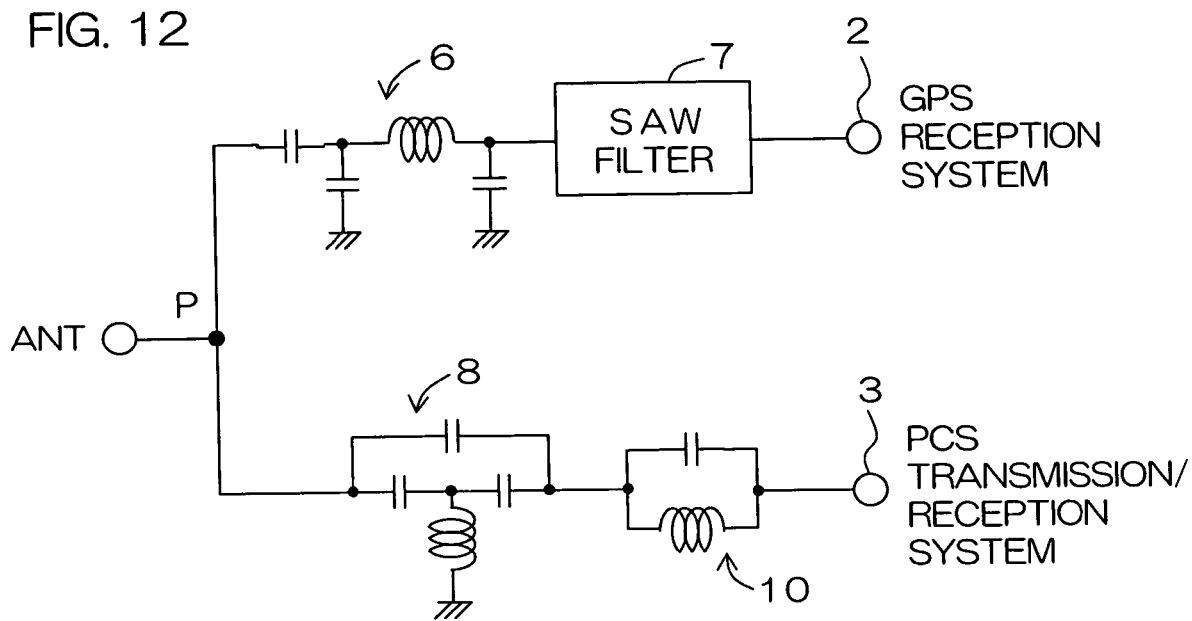
FIG. 12 shows a circuit equivalent to the composite multiplexer circuit, the equivalent circuit which is one step increased in the higher-harmonic reducing function but maintains the multiplexing function of the composite multiplexer circuit as it is.

FIG. 12 shows an exemplary configuration of a circuit which is one step increased in the higher-harmonic reducing function but maintains the multiplexing function of the aforementioned composite multiplexer circuit as it is.

The composite multiplexer circuit of FIG. 12 has the configuration wherein a band elimination filter (hereinafter, referred to as "BEF") 10 is added to the HPF 8 in the composite multiplexer circuit of FIG. 6, the HPF 8 operative to extract the high-frequency signal to the PCS transmission/reception system.

By adding the BEF 10 in this manner, the third frequency band of the PCS transmission/reception system may be reduced in the higher harmonics, such as the doubled frequency wave and the tripled frequency wave.

Figure 13:
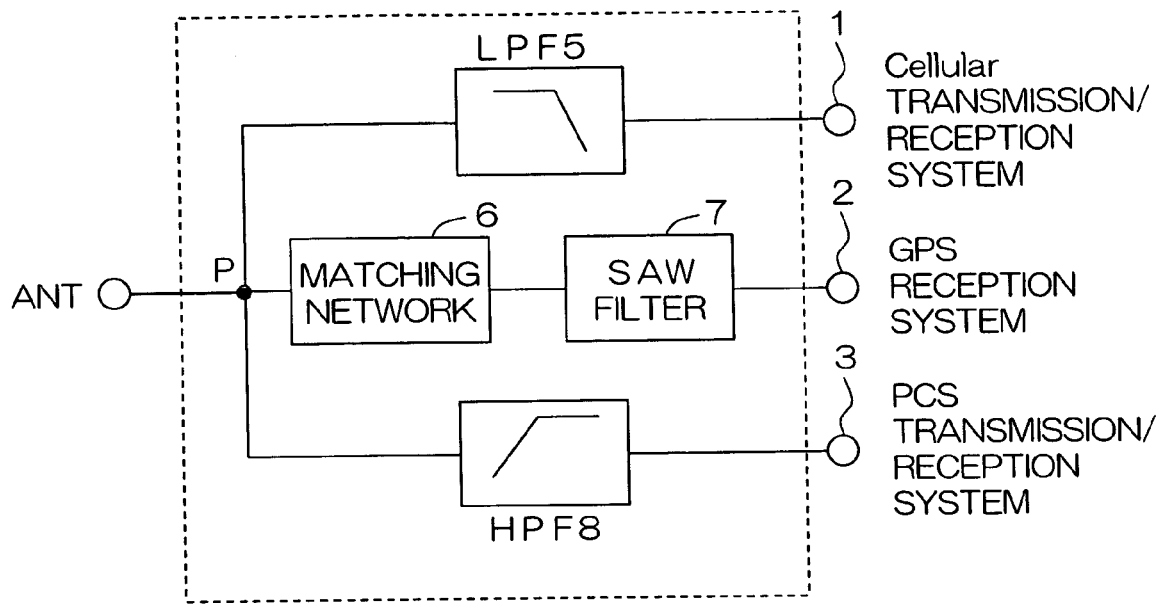
FIG. 13 is a block diagram showing still another example of the composite multiplexer circuit according to the invention.
Figure 14:
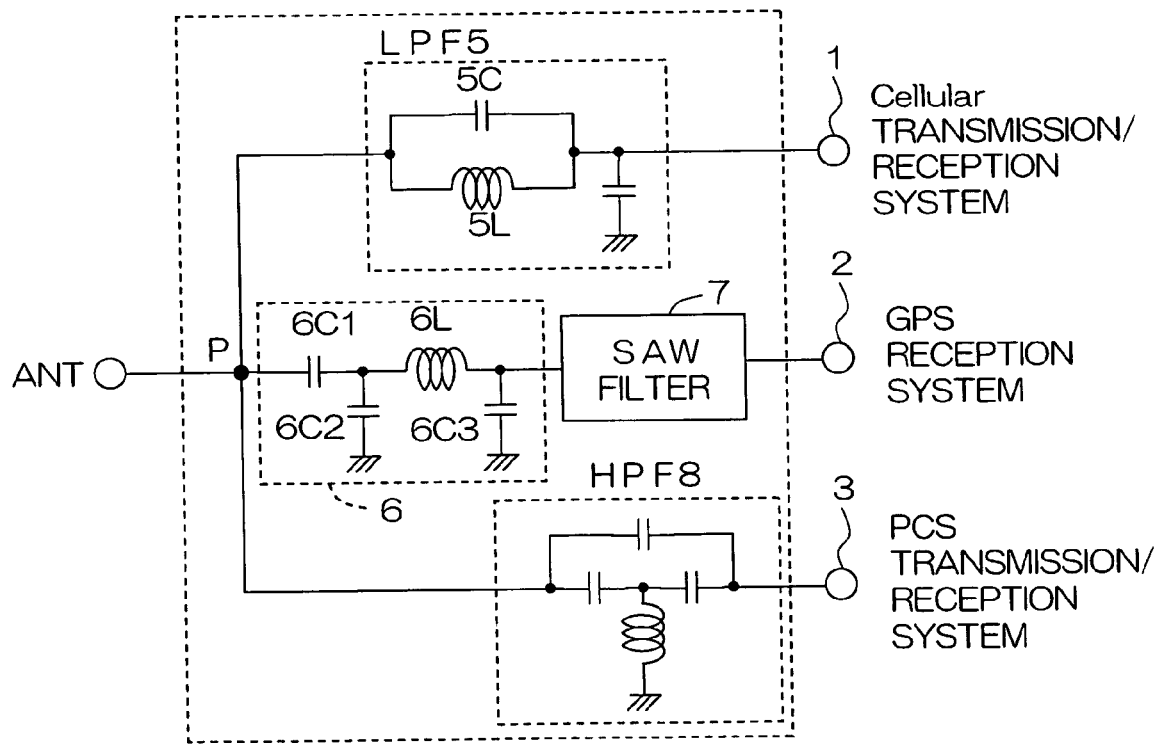
FIG. 14 is a diagram showing a circuit equivalent to the composite multiplexer circuit.

FIG. 13 is a block diagram showing a composite multiplexer circuit according to still another configuration of the invention. FIG. 14 is a circuit diagram of the above composite multiplexer circuit.

The composite multiplexer circuit corresponds to triple bands while the three communication systems include the Cellular communication system (the first frequency band: 800 MHz), the GPS communication system (the second frequency band: 1500 MHz), and the PCS communication system (the third frequency band: 1900 MHz).

The composite multiplexer circuit includes: the ANT terminal connected with the antenna; the first terminal 1 for input/output of the transmission/reception high-frequency signals in the first frequency band; the second terminal 2 for input of the reception high-frequency signal in the second frequency band; and the third terminal 3 for input/output of the transmission/reception high-frequency signals in the third frequency band.

Connected between the ANT terminal and the first terminal 1 is the low pas filter (hereinafter, referred to as "LPF") 5 shown in FIG. 1 and FIG. 2.

As shown in FIG. 14, the LPF 5 is an LC filter including strip lines 5L and a capacitor SC formed at some of the individual layers of the multilayered substrate. The LPF 5 is designed to attenuate the frequency bands of the PGS communication system and the PCS communication system. While the frequency band of the Cellular communication system contains the higher harmonics such as the doubled frequency wave and the tripled frequency wave, the LPF 5 is also capable of attenuating such higher harmonics.

Inserted between the ANT terminal and the second terminal 2 are the matching network 6 comprising an inductor 6L and capacitors 6C1, 6C2, 6C3, and the SAW filter 7. The matching network 6 comprises: the series capacitor 6C1 connected with the ANT terminal; the parallel capacitor 6C2 connected with the ground; the series inductor 6L; and the parallel capacitor 6C3, these components interconnected in the order named. These components each may comprise strip lines or a capacitor formed within the multilayered substrate or otherwise, may employ a chip component of an inductor or a capacitor.

The matching network 6 is necessary for increasing the respective impedances in the first frequency band and the third frequency band between the ANT terminal and the second terminal 2. The network rotates the respective phases of the low impedances in the first frequency band and the third frequency band provided by the SAW filter 7 alone, thereby increasing these impedances while maintaining the impedance in the second frequency band in the matched state.

Respective admittances in the first frequency band (800 MHz), the second frequency band (1500 MHz) and the third frequency band (1900 MHz) in the Cellular transmission/reception system are expressed as follows, the Cellular transmission/reception system viewed from a junction point P where the composite multiplexer circuit is divided into three branches:

$Y1a = G1a + jB1a,$ $Y2a = G2a + jB2a,$ $Y3a = G3a + jB3a.$

Figure 15:
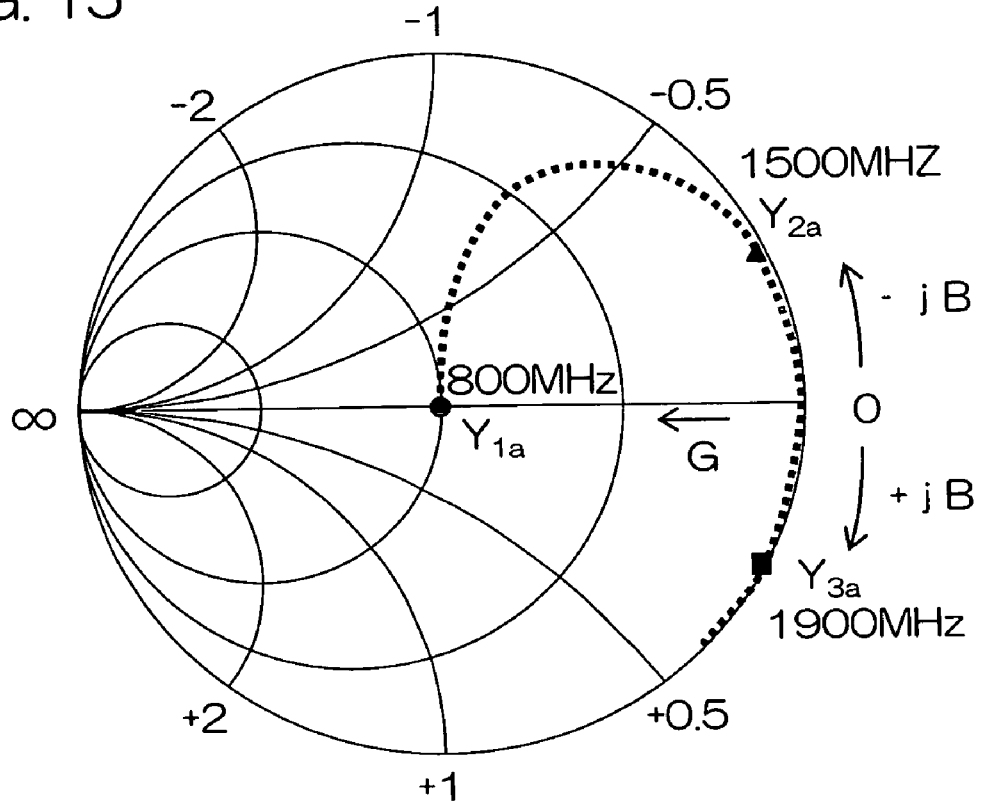
FIG. 15 is an admittance chart showing admittances in a Cellular transmission/reception system of the composite multiplexer circuit as viewed from a junction point P.

The positional relation among these admittances is shown in an admittance chart of FIG. 15.

Furthermore, respective admittances in the first frequency band (800 MHz), the second frequency band (1500 MHz) and the third frequency band (1900 MHz) in the GPS reception system are expressed as follows, the GPS reception system viewed from the junction point P:

$Y1b = G1b + jB1b,$ $Y2b = G2b + jB2b,$ $Y3b = G3b + jB3b.$

Figure 16:
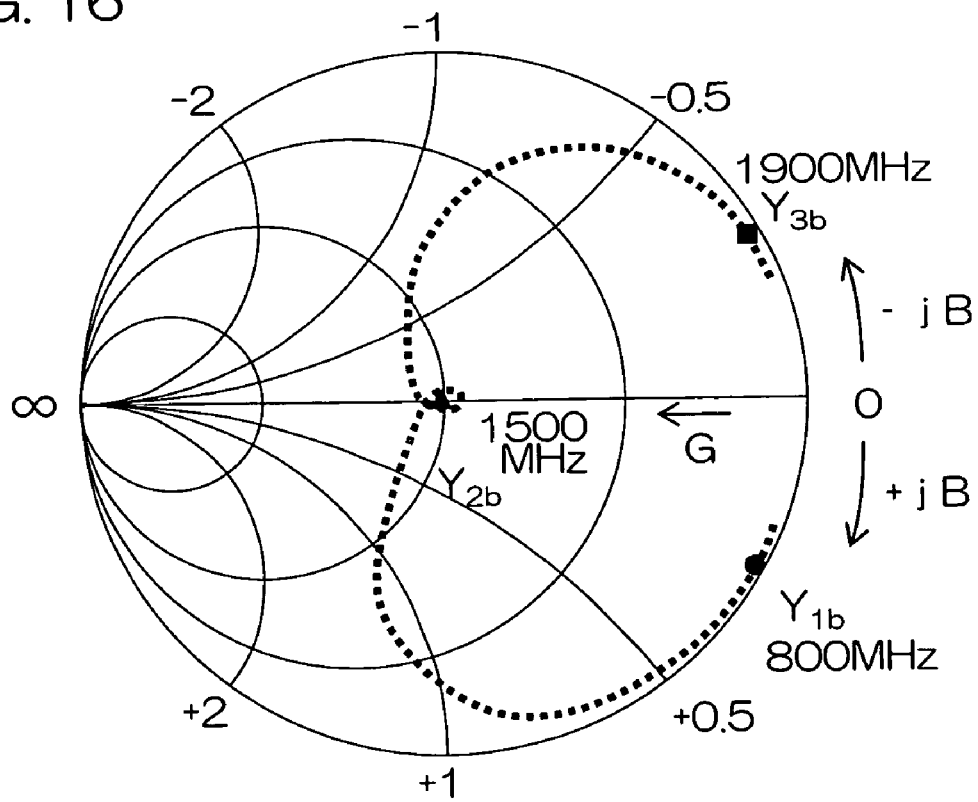
FIG. 16 is an admittance chart showing admittances in a GPS reception system of the composite multiplexer circuit as viewed from the junction point P.

The positional relation among these admittances is shown in an admittance chart of FIG. 16.

Furthermore, respective admittances in the first frequency band (800 MHz), the second frequency band (1500 MHz) and the third frequency band (1900 MHz) in the PCS transmission/reception system are expressed as follows, the PCS transmission/reception system viewed from the junction point P:

$Y1c = G1c + jB1c,$ $Y2c = G2c + jB2c,$ $Y3c = G3c + jB3c.$

Figure 17:
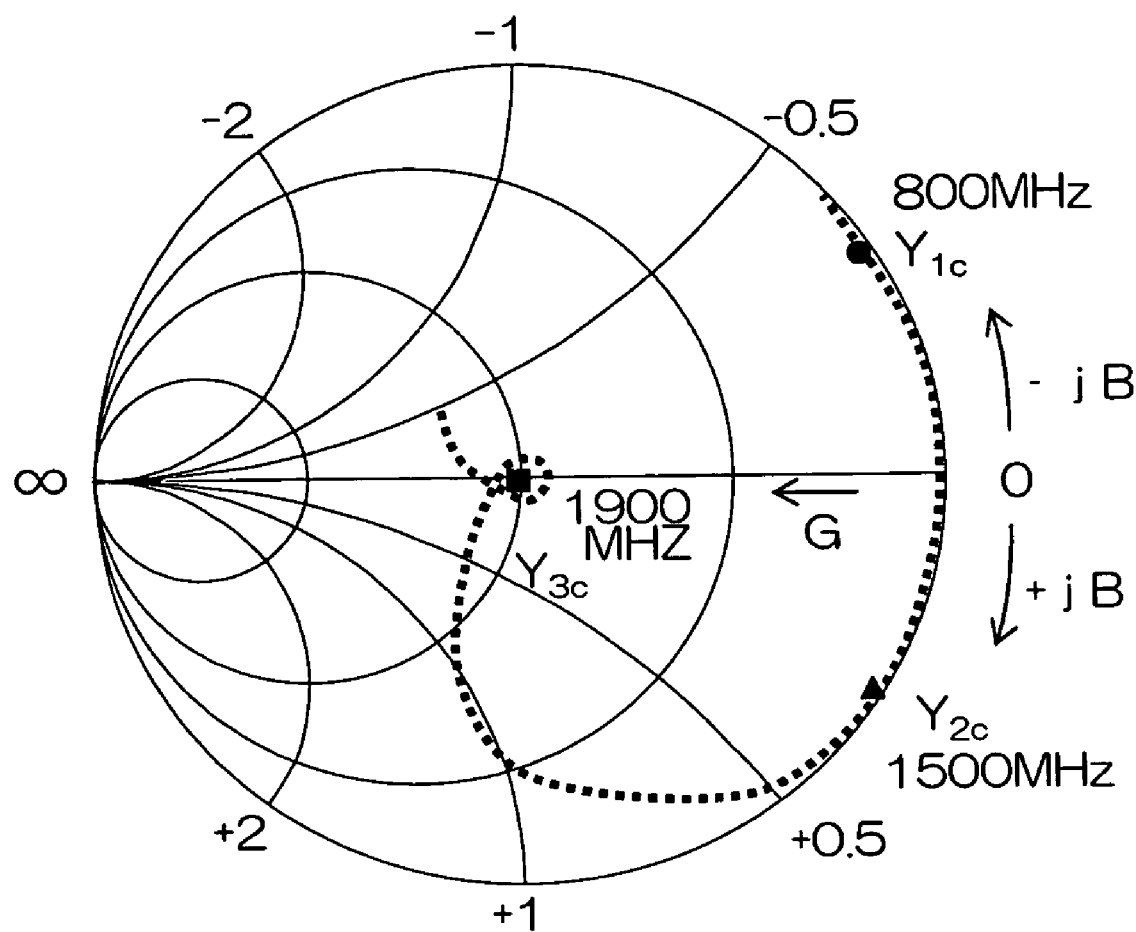
FIG. 17 is an admittance chart showing admittances in a PCS transmission/reception system of the composite multiplexer circuit as viewed from the junction point P.

The positional relation among these admittances is shown in an admittance chart of FIG. 17.

It is possible to obtain a composite multiplexer circuit featuring a good matching performance if the matching conditions in the composite multiplexer circuit are so designed as to satisfy the following expressions (3):

$$Gna + Gnb + Gnc = 1$$

$$Bna + Bnb + Bnc = 0 (n=1, 2, 3) \qquad (3)$$

where "n" represents a numeral indicating a frequency band. The above expressions must hold for every one of the cases n=1, 2, 3. It is noted that the value "1" of the above expression is normalized by a characteristic admittance Y0 (Y0 defined to be 0.02S, for example).

Next, exemplary numerical values of the matching network 6 are explained as below.

The series inductor 6L constituting the matching network 6 may preferably employ an inductor which has an inductance of 15 nH or less and has a Q of 15 or more as determined at 800 MHz, whereby the matching network has a configuration reduced in the insertion loss between the ANT terminal at 1.5 GHz and the second terminal 2. It is noted, however, that the value of the series capacitor C1 is set to 1.0 pF; the value of the parallel capacitor C2 is set to 0.25 pF; and the value of the parallel capacitor C3 is set to 2.4 pF.

Figure 18:
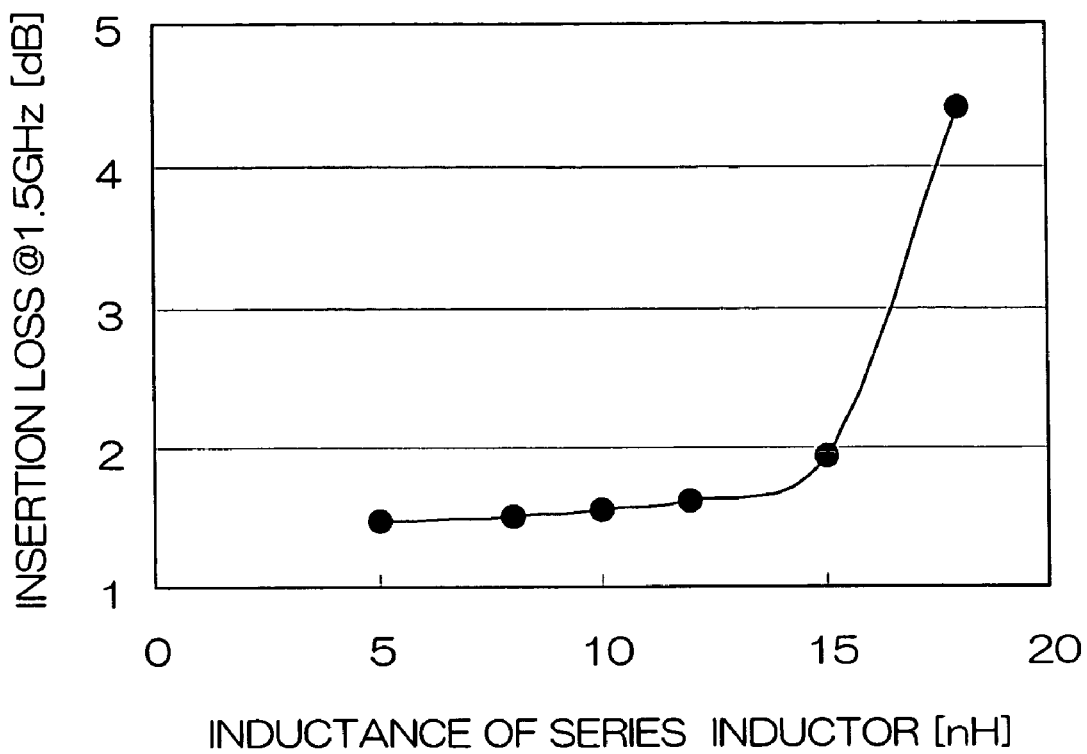
FIG. 18 is a graphical representation of a relation between the inductance value of a series inductor of a matching network 6 and the insertion loss in the second frequency band.

A relation between the inductance and the insertion loss between the ANT terminal and the second terminal 2 is shown in FIG. 18. A relation between the Q and the insertion loss between the ANT terminal and the second terminal 2 is shown in FIG. 19.

FIG. 18 shows the inductance of the series inductor 6L on the abscissa, and the insertion loss at 1.5 GHz on the ordinate. The graph indicates the relation that as the inductance is increased, the insertion loss is correspondingly increased. Assuming that the insertion loss shown in FIG. 18 is controlled to 2.0 dB or less, it is understood that the inductance of the series inductor 6L is best defined to be 15 nH or less.

Figure 19:
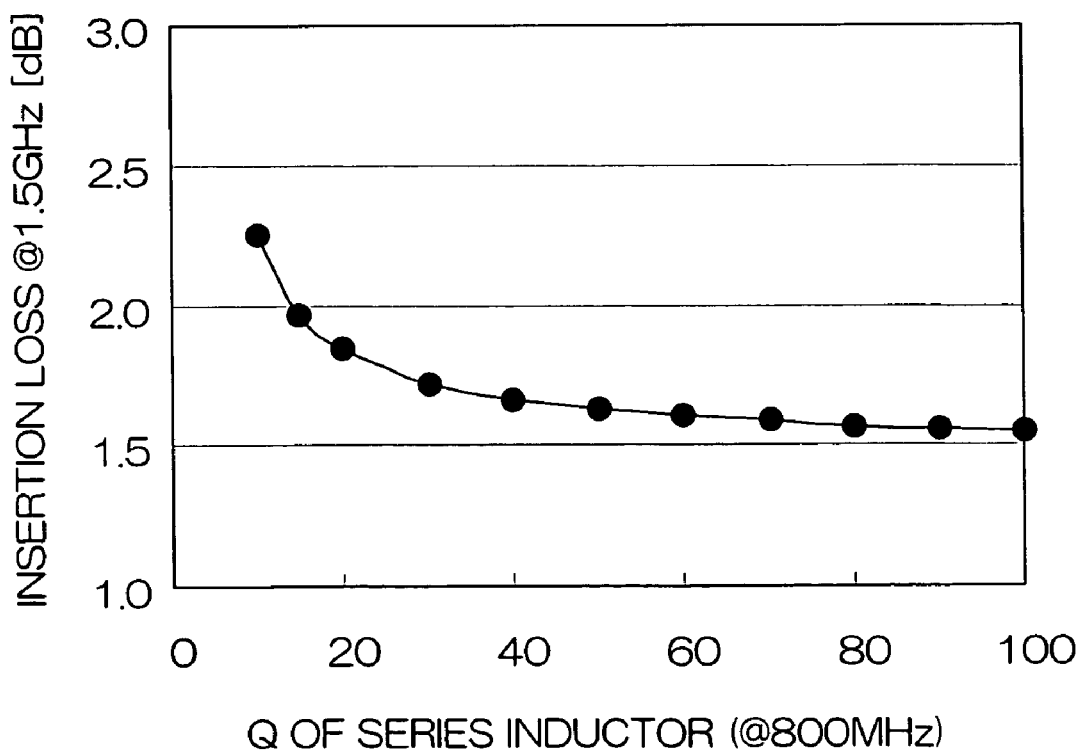
FIG. 19 is a graphical representation of a relation between the Q of the series inductor L of the matching network 6 and the insertion loss in the second frequency band.

FIG. 19 shows the Q of the series inductor 6L on the abscissa, and the insertion loss at 1.5 GHz on the ordinate. The graph indicates the relation that as the Q is increased, the insertion loss is correspondingly decreased. Assuming that the insertion loss at 1.5 GHz shown in FIG. 19 is controlled to 2.0 dB or less, it is understood that the Q of the series inductor 6L is best defined to be 15 or more.

The SAW filter 7 inserted between the ANT terminal and the second terminal 2 may preferably employ a SAW filter which is supplied with an unbalanced high-frequency signal for outputting a balanced high-frequency signal. Since the balanced output is characterized by high resistance against high-frequency noises, the high-frequency signal outputted from the SAW filter facilitates the extraction of information data.

The matching network 6 cooperates with the SAW filter 7 to attenuate the frequency bands of the Cellular communication system and the PCS communication system.

Formed between the ANT terminal and the third terminal 3 is the high pass filter (hereinafter, referred to as "HPF") 8. The HPF 8 also comprises strip lines and a capacitor formed within the multilayered substrate.

The HPF 8 is designed to attenuate the frequency bands of the Cellular communication system and the GPS communication system. While the frequency band of the Cellular communication system contains the higher harmonics such as the doubled frequency wave and the tripled frequency wave, such higher harmonics may also be attenuated.

Figure 20:
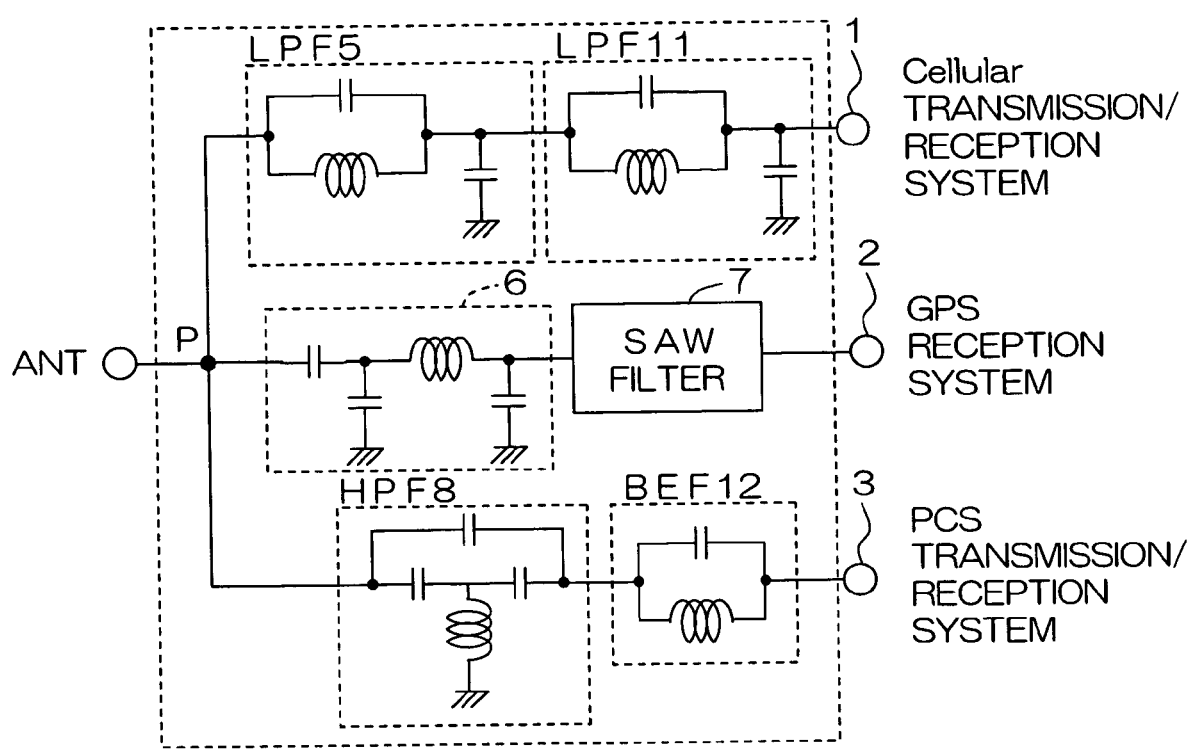
FIG. 20 shows a circuit equivalent to the composite multiplexer circuit, the equivalent circuit which is one step increased in the higher-harmonic reducing function but maintains the multiplexing function of the composite multiplexer circuit as it is.

FIG. 20 shows a configuration of a composite multiplexer circuit which is one step increased in the higher-harmonic reducing function but maintains the multiplexing function of the aforementioned composite multiplexer circuit as it is.

The composite multiplexer circuit of FIG. 20 is formed by adding the following circuits to the composite multiplexer circuit of FIG. 14. That is, an LPF 11 is added to the LPF 5 constituting the circuit for extracting the high-frequency signal in the first frequency band, whereas a band elimination filter (hereinafter, referred to as "BEF") 12 is added to the HPF 8 which constitutes the circuit for extracting the high-frequency signal in the third frequency band.

By adding the LPF 11 and the BEF 12 in this manner, the first frequency band may be reduced in the higher harmonics including the doubled frequency wave and the tripled frequency wave, while the third frequency band may be reduced in the higher harmonics including the doubled frequency wave and the tripled frequency wave.

Next, an embodiment of the invention employing a filter of an LC device instead of the SAW filter is described in details with reference to the accompanying drawings.

Figure 21:
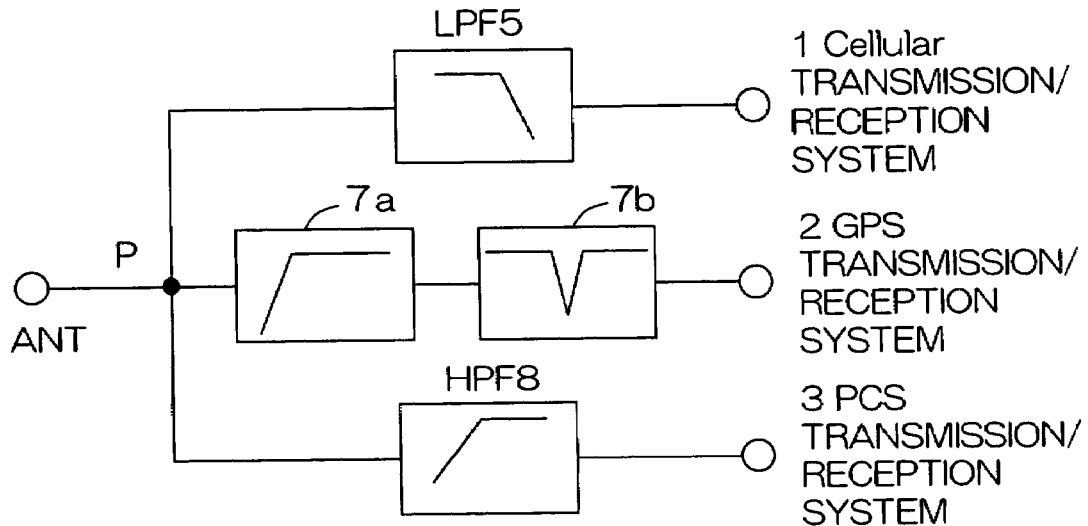
FIG. 21 is a block diagram showing a configuration of a composite multiplexer circuit according to still another circuit configuration of the invention.
Figure 22:
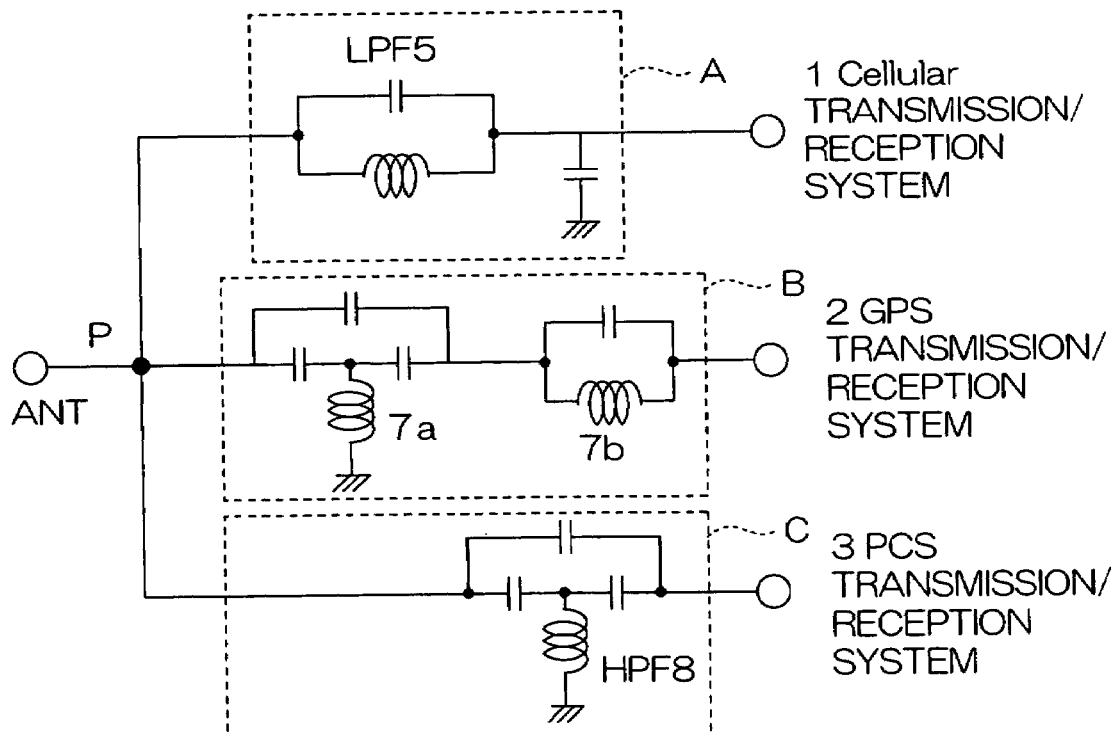
FIG. 22 shows a circuit equivalent to the above composite multiplexer circuit.

FIG. 21 is a block diagram showing a configuration of a composite multiplexer circuit according to still another circuit configuration of the invention. FIG. 22 shows a circuit equivalent to the above composite multiplexer circuit.

This composite multiplexer circuit corresponds to triple bands while the three communication systems include the Cellular communication system (the first frequency band: 800 MHz), the GPS communication system (the second frequency band: 1500 MHz); and the PCS communication system (the third frequency band: 1900 MHz).

It is noted that any frequency bands including those of the GSM, GPS, DCS, Cellular, PCS, W-CDMA and such are applicable to the first, second and third frequency bands.

The composite multiplexer circuit includes: the ANT terminal connected with the antenna; the first terminal 1 for input/output of the transmission/reception high-frequency signals in the first frequency band; the second terminal 2 for input of the reception high-frequency signal in the second frequency band; and the third terminal 3 for input/output of the transmission/reception high-frequency signals in the third frequency band.

The low-pass filter circuit (hereinafter referred to as "LPF") 5 is connected between the ANT terminal and the first terminal 1. A circuit constituted by the LPF 5 will be represented by a reference character "A".

The LPF 5 is an LC filter comprising strip lines and a capacitor formed at some of the individual layers of the multilayered substrate. The LPF 5 is designed to attenuate the frequency bands of the GPS communication system and the PCS communication system. While the frequency band of the Cellular communication system contains the higher harmonics including the doubled frequency wave and the tripled frequency wave, the filter is also capable of attenuating such higher harmonics.

Connected between the ANT terminal and the second terminal 2 are a high pass filter circuit (hereinafter, referred to as "HPF") 7a, and a band elimination filter circuit (hereinafter, referred to as "BEF") 7b. The HPF 7a and BEF 7b each comprise strip lines and a capacitor formed at some of the individual layers in the multilayered substrate. A circuit constituted by the HPF 7a and the BEF 7b will be represented by a reference character "B".

The HPF 7a is designed to attenuate the frequency band of the Cellular communication system, whereas the BEF 7b is designed to attenuate the frequency band of the PCS communication system.

Furthermore, the HPF 7a attenuates the lower frequencies of the frequency band and hence, the HPF is also capable of attenuating static electricity (up to 300 MHz) affecting a SAW filter, which may be connected rearwardly of the second terminal 2. Thus, the HPF 7a can also play the role of protecting the SAW filter connected to the rear stage of the circuit.

The BEF 7b inserted rearwardly of the HPF 7a may also be designed to play the role of reducing the higher harmonics in the PCS communication system by defining a length between an input terminal of the SAW filter connected rearwardly of the second terminal 2 and the ANT terminal to be $\lambda(2n-1)/4$ of the frequency band of the PCS communication system ($\lambda$: wavelength, n: natural number).

On the other hand, the HPF 8 is formed between the ANT terminal and the third terminal 3. This HPF 8 also comprises strip lines and a capacitor formed within the multilayered substrate. A circuit constituted by the HPF 8 will be represented by HPF 8 will be represented by a reference character "C".

The HPF 8 is designed to attenuate the frequency bands of the Cellular communication system and the GPS communication system. The design is also adapted to attenuate the higher harmonics including the doubled frequency wave and the tripled frequency wave, which are contained in the frequency band of the PCS communication system.

Respective admittances in the first frequency band (800 MHz), the second frequency band (1500 MHz) and the third frequency band (1900 MHz) in the circuit A are expressed as follows, the circuit A viewed from a junction point P where the composite multiplexer circuit is divided into three branches:

$Y1d = G1d + jB1d$, $Y2d = G2d + jB2d$, $Y3d = G3d + jB3d$.

Figure 23:
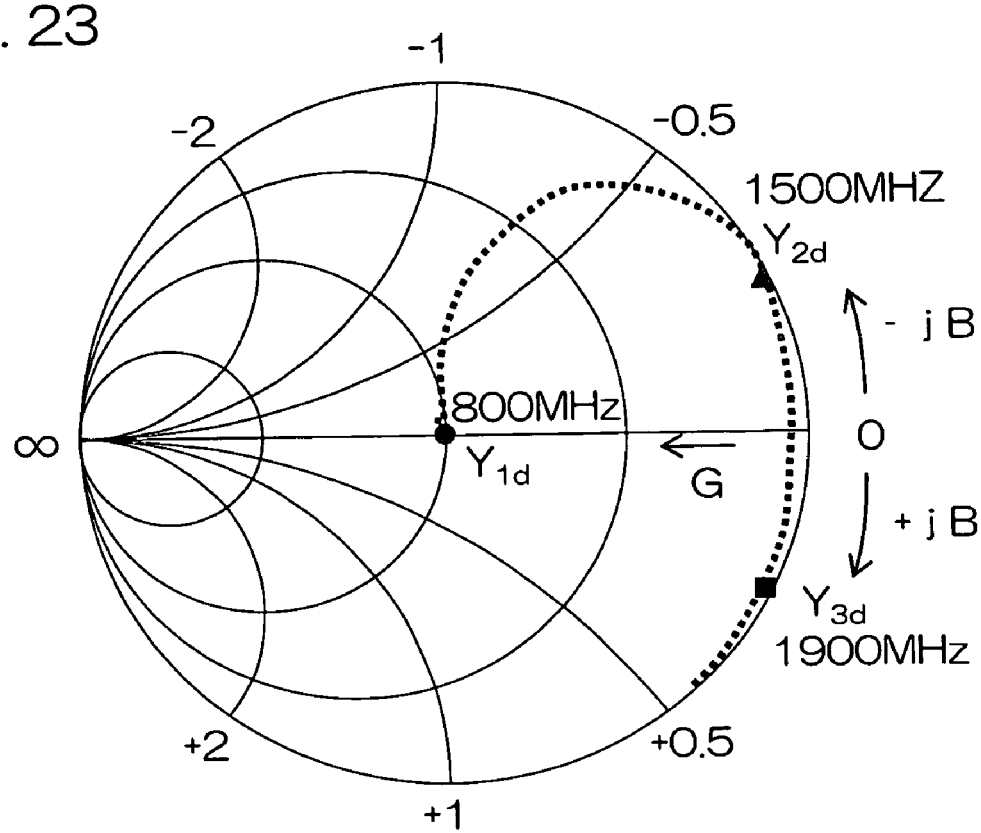
FIG. 23 is an admittance chart showing admittances in a circuit A of the composite multiplexer circuit as viewed from a junction point P.

The positional relation among these admittances is shown in an admittance chart of FIG. 23.

Furthermore, respective admittances in the first frequency band (800 MHz), the second frequency band (1500 MHz) and the third frequency band (1900 MHz) in the circuit B are expressed as follows, the circuit B viewed from the junction point P:

$Y1e = G1e + jB1e$, $Y2e = G2e + jB2e$, $Y3e = G3e + jB3e$.

Figure 24:
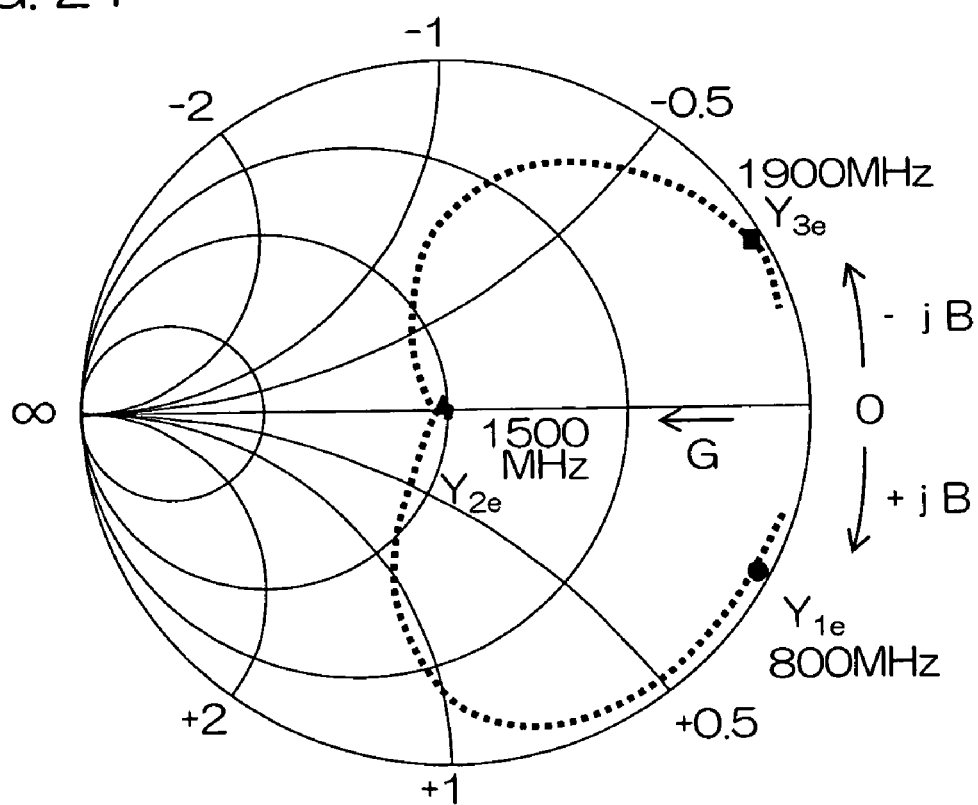
FIG. 24 is an admittance chart showing admittances in a circuit B of the composite multiplexer circuit as viewed from the junction point P.

The positional relation among these admittances is shown in an admittance chart of FIG. 24.

Furthermore, respective admittances in the first frequency band (800 MHz), the second frequency band (1500 MHz) and the third frequency band (1900 MHz) in the circuit C are expressed as follows, the circuit C viewed from the junction point P:

$Y1f = G1f + jB1f,$ $Y2f = G2f + jB2f,$ $Y3f = G3f + jB3f.$

Figure 25:
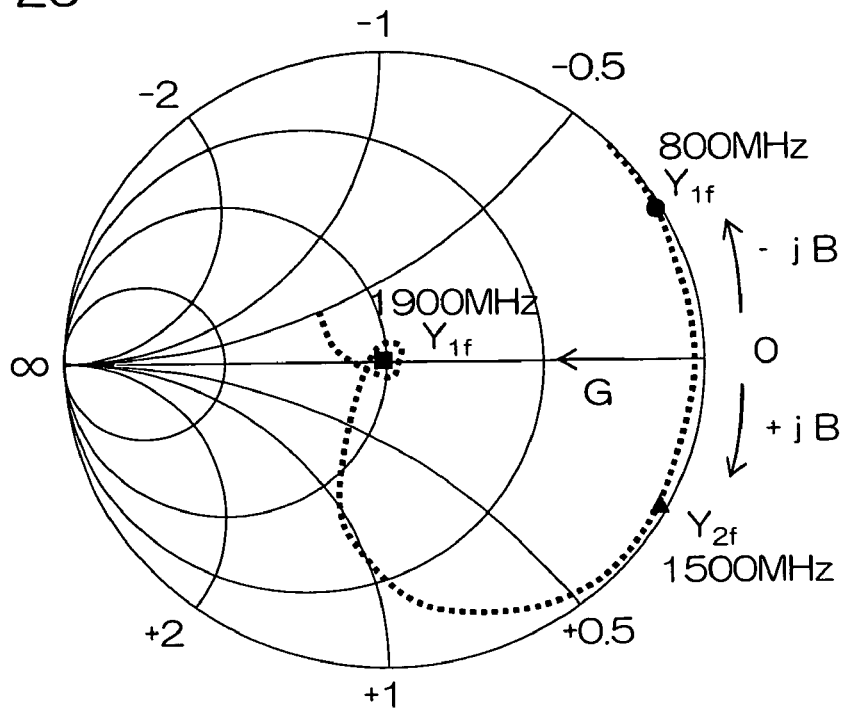
FIG. 25 is an admittance chart showing admittances in a circuit C of the composite multiplexer circuit as viewed from the junction point P.

The positional relation among these admittances is shown in an admittance chart of FIG. 25.

It is possible to obtain a composite multiplexer circuit featuring a good matching performance if the matching conditions in the above circuit A, circuit B and circuit C are so designed as to satisfy the following expressions (4):

$Gnd + Gne + Gnf = 1$ $Bnd + Bne + Bnf = 0 (n=1, 2, 3)$ (4)

where "n" represents a numeral indicating a frequency band. The above expressions must hold for every one of the cases n=1, 2, 3. It is noted that the value "1" of the above expression is normalized by a characteristic admittance Y0 (Y0 defined to be 0.02S, for example).

Figure 26:
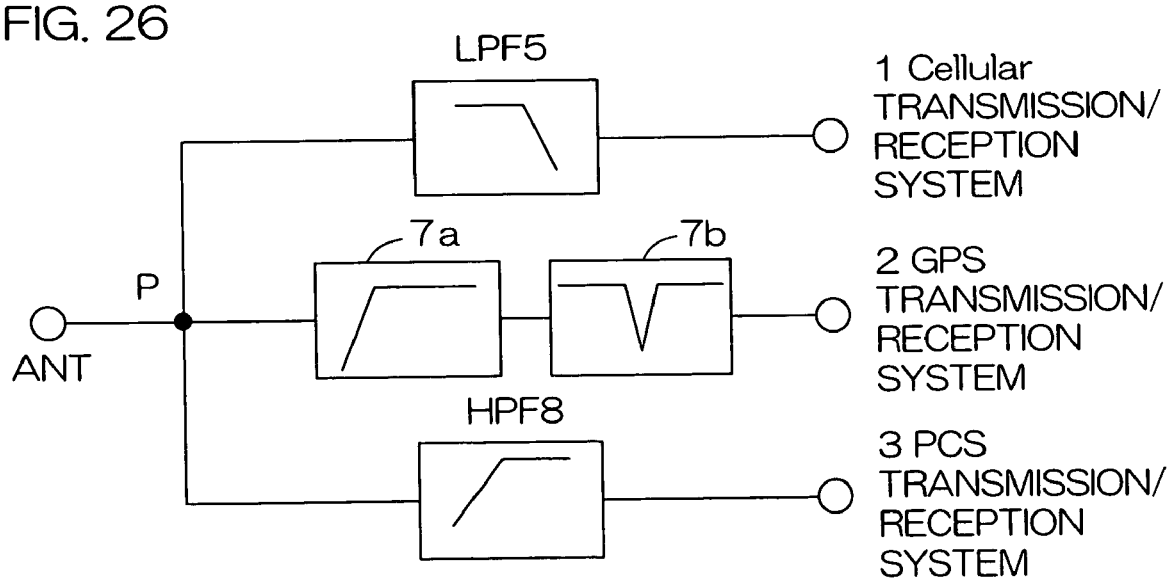
FIG. 26 is a block diagram showing a configuration of a composite multiplexer circuit according to still another circuit configuration of the invention.
Figure 27:
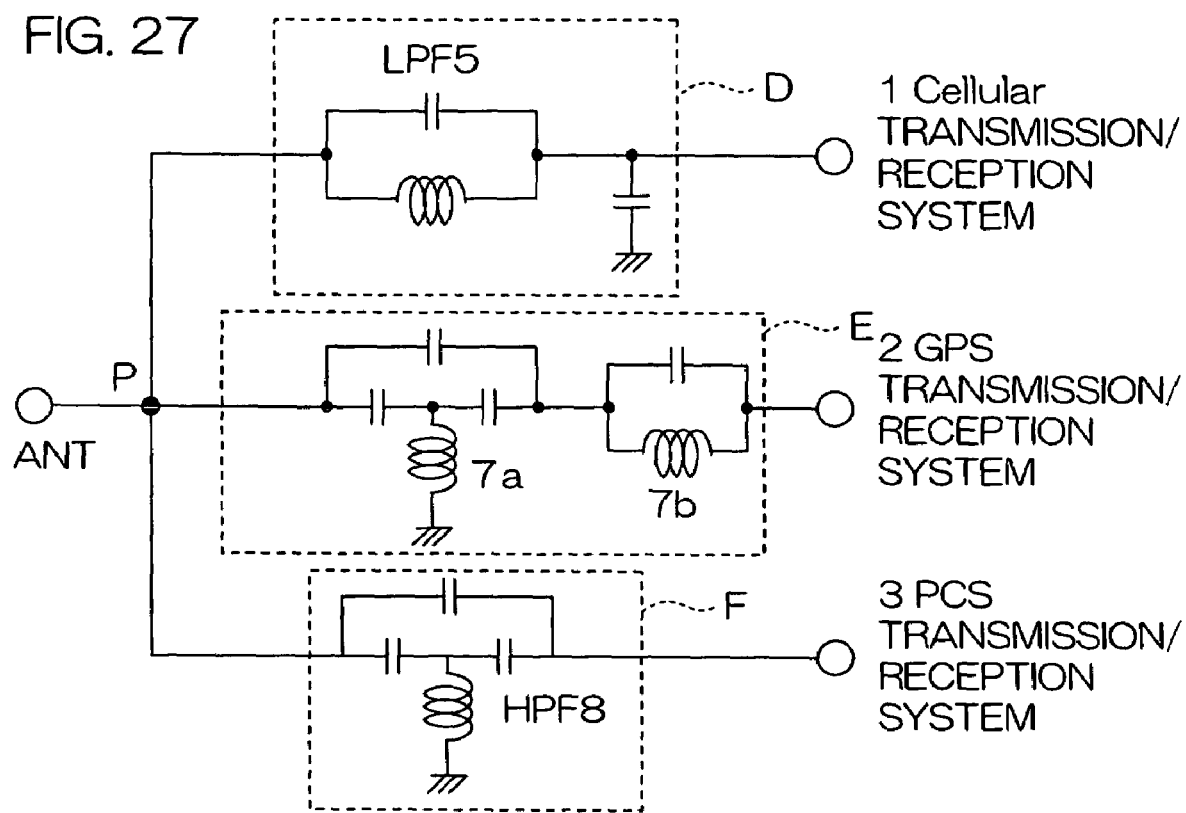
FIG. 27 shows a circuit equivalent to the composite multiplexer circuit.

FIG. 26 is a block diagram showing a configuration of a composite multiplexer circuit according to still another circuit configuration of the invention. FIG. 27 shows a circuit equivalent to the above composite multiplexer circuit.

This composite multiplexer circuit corresponds to triple bands while the three communication systems include the Cellular communication system (the first frequency band: 800 MHz), the GPS communication system (the second frequency band: 1500 MHz); and the PCS communication system (the third frequency band: 1900 MHz).

The composite multiplexer circuit includes: the ANT terminal connected with the antenna; the first terminal 1 for input/output of the transmission/reception high-frequency signals in the first frequency band; the second terminal 2 for input of the reception high-frequency signal in the second frequency band; and the third terminal 3 for input/output of the transmission/reception high-frequency signals in the third frequency band.

Connected between the ANT terminal and the first terminal 1 is the LPF 5 shown in FIG. 26 and FIG. 27. A circuit constituted by the LPF 5 will be represented by a reference character "D".

The LPF 5 is an LC filter comprising strip lines and a capacitor formed at some of the individual layers of the multilayered substrate. The LPF 5 is designed to attenuate the frequency bands of the GPS communication system and the PCS communication system. While the frequency band of the Cellular communication system contains the higher harmonics including the doubled frequency wave and the tripled frequency wave, the filter is also capable of attenuating such higher harmonics.

Connected between the ANT terminal and the second terminal 2 are the HPF 7a and the BEF 7b. Each of the parallel inductor 9, the HPF 7a and the BEF 7b comprises strip lines and a capacitor formed at some of the individual layers of the multilayered substrate. A circuit constituted by the HPF 7a and the BEF 7b will be represented by a reference character "E".

The HPF 7a is designed to attenuate the frequency band of the Cellular communication system, whereas the BEF 7b is designed to attenuate the frequency band of the PCS communication system.

In addition, the HPF 7a attenuates the lower frequencies of the frequency band and hence, the HPF is also capable of attenuating static electricity (up to 300 MHz) affecting a SAW filter, which may be connected rearwardly of the second terminal 2. Thus, the HPF 7a can also play the role of protecting the SAW filter connected to the rear stage of the circuit.

The BEF 7b inserted rearwardly of the HPF 7a may also be designed to play the role of reducing the higher harmonics in the PCS communication system by defining a length between an input terminal of the SAW filter connected rearwardly of the second terminal 2 and the ANT terminal to be λ(2n−1)/4 of the frequency band of the PCS communication system (λ: wavelength, n: natural number).

On the other hand, the HPF 8 is connected between the ANT terminal and the third terminal 3. This HPF 8 also comprises strip lines and a capacitor formed within the multilayered substrate. A circuit constituted by the HPF 8 will be represented by a reference character "F".

The HPF 8 is designed to attenuate the frequency bands of the Cellular communication system and the GPS communication system. The design is also adapted to attenuate the higher harmonics including the doubled frequency wave and the tripled frequency wave, which are contained in the frequency band of the PCS communication system.

Next, respective admittances in the first frequency band (800 MHz), the second frequency band (1500 MHz) and the third frequency band (1900 MHz) in the circuit D are expressed as follows, the circuit D viewed from a junction point P where the composite multiplexer circuit is divided into three branches:

$Y1g = G1g + jB1g,$ $Y2g = G2g + jB2g,$ $Y3g = G3g + jB3g.$

Figure 28:
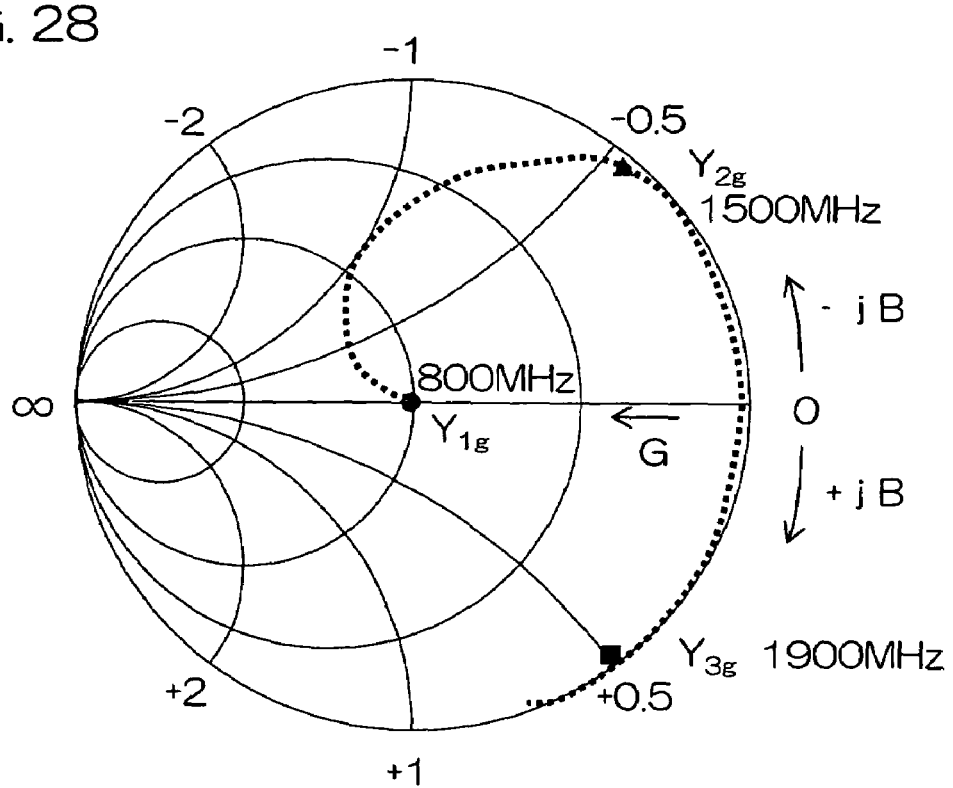
FIG. 28 is an admittance chart showing admittances in a circuit D of the composite multiplexer circuit as viewed from a junction point P.

The positional relation among these admittances is shown in an admittance chart of FIG. 28.

Furthermore, respective admittances in the first frequency band (800 MHz), the second frequency band (1500 MHz) and the third frequency band (1900 MHz) in the circuit E are expressed as follows, the circuit E viewed from the junction point P:

$Y1h = G1h + jB1h,$ $Y2h = G2h + jB2h,$ $Y3h = G3h + jB3h.$

Figure 29:
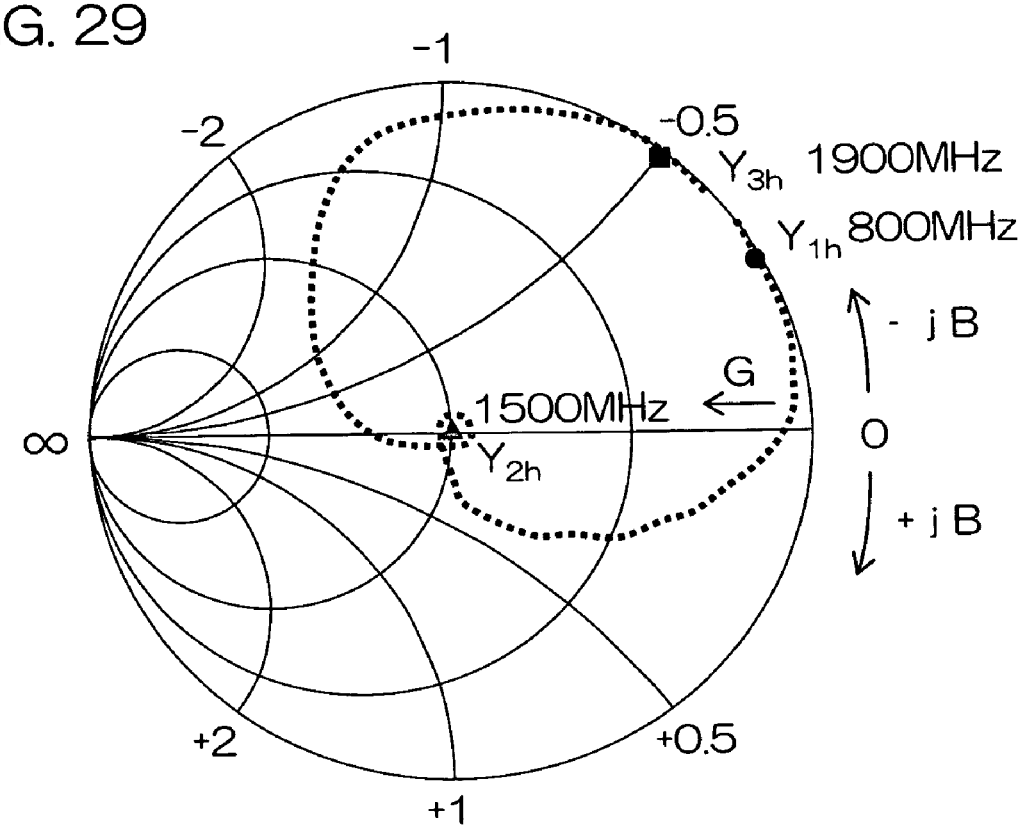
FIG. 29 is an admittance chart showing admittances in a circuit E of the composite multiplexer circuit as viewed from the junction point P.

The positional relation among these admittances is shown in an admittance chart of FIG. 29.

Furthermore, respective admittances in the first frequency band (800 MHz), the second frequency band (1500 MHz) and the third frequency band (1900 MHz) in the circuit F are expressed as follows, the circuit F viewed from the junction point P:

$Y1i = G1i + jB1i,$ $Y2i = G2i + jB2i,$ $Y3i = G3i + jB3i.$

Figure 30:
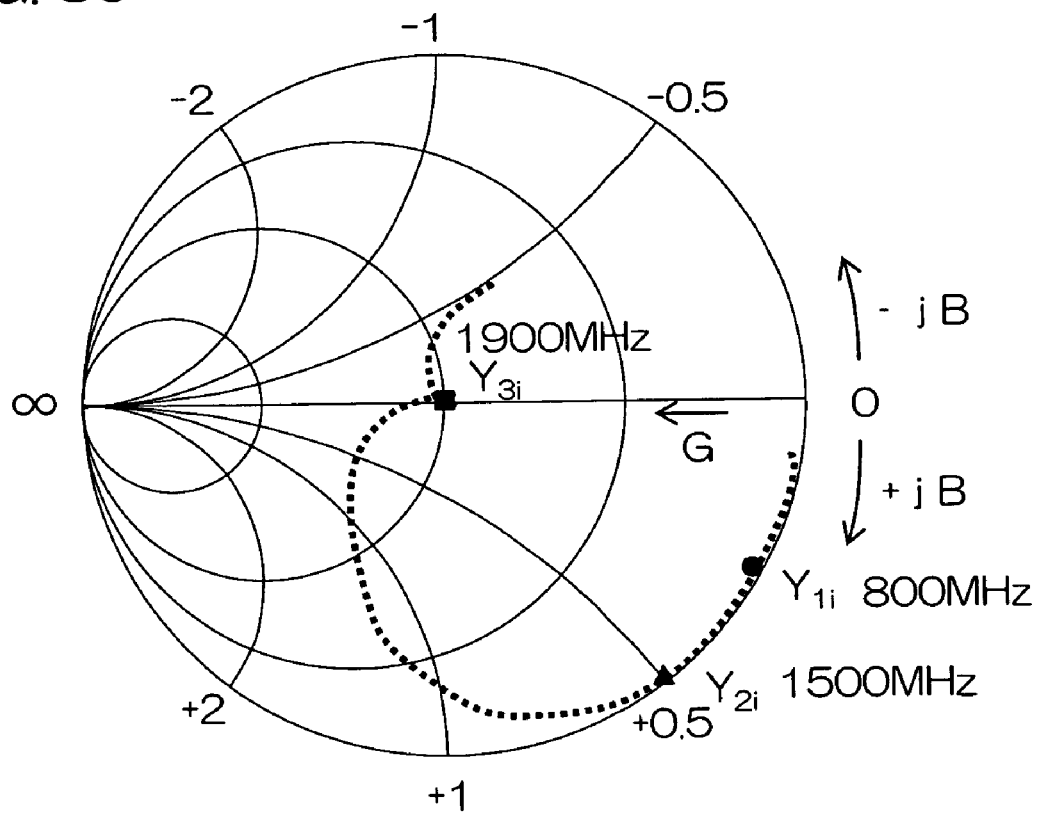
FIG. 30 is an admittance chart showing admittances in a circuit F of the composite multiplexer circuit as viewed from the junction point P

The positional relation among these admittances is shown in an admittance chart of FIG. 30.

It is possible to obtain a composite multiplexer circuit featuring a good matching performance if the matching conditions in the above circuits D, E and F are so designed as to satisfy the following expressions (5)

$$Gng+Gnh+Gni=1$$

$$Bng+Bnh+Bni=0 (n=1, 2, 3) \quad (5)$$

where "n" represents a numeral indicating a frequency band. The above expressions must hold for every one of the cases n=1, 2, 3.

Figure 31:
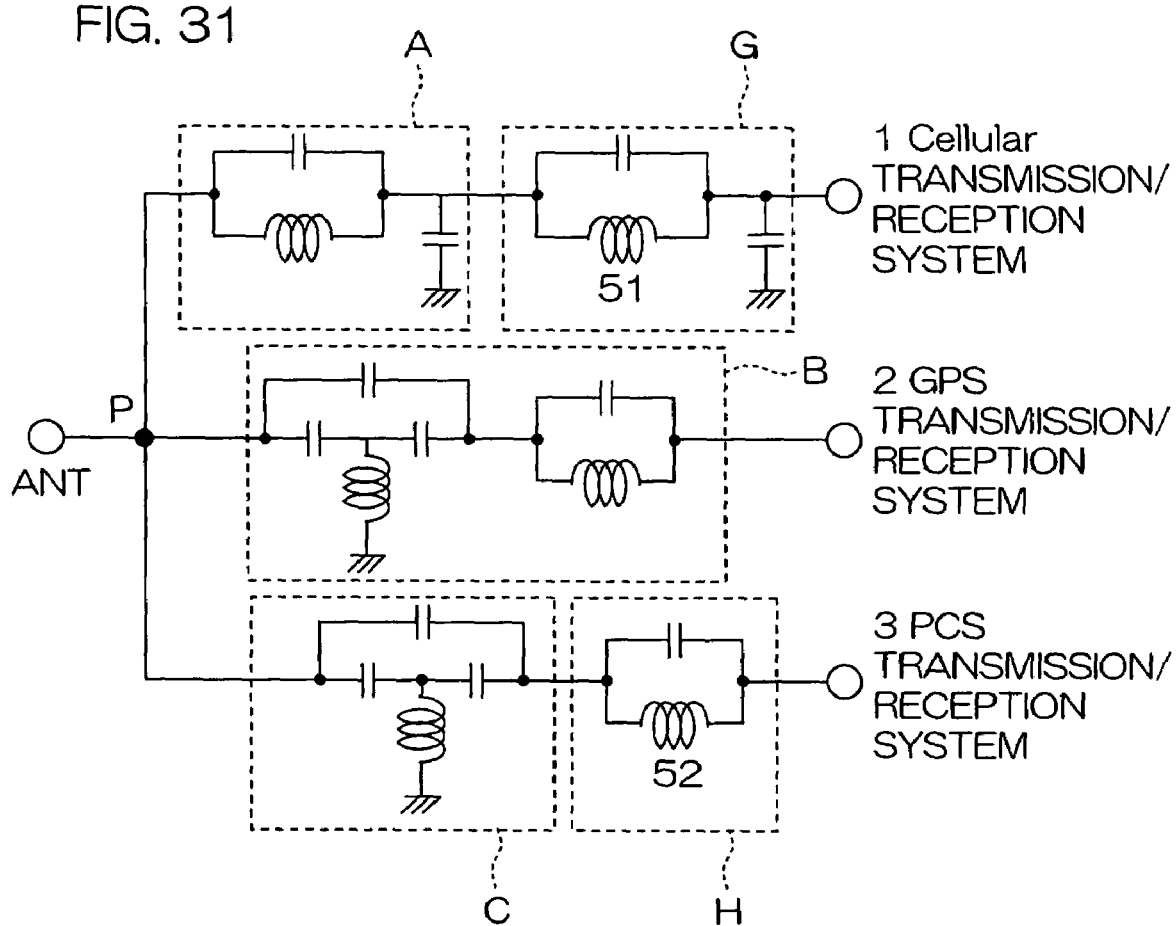
FIG. 31 is a block diagram showing a configuration of a composite multiplexer circuit which is one step increased in the higher-harmonic reducing function but maintains the multiplexing function of the composite multiplexer circuit as it is.

FIG. 31 shows an exemplary configuration of a composite multiplexer circuit which is one step increased in the higher-harmonic reducing function but maintains the multiplexing function of the aforementioned composite multiplexer circuit as it is.

The composite multiplexer circuit of FIG. 31 is formed by adding the following circuits to the composite multiplexer circuit of FIG. 22. That is, an LPF 51 is added to the LPF 5 constituting the circuit A for extracting the high-frequency signal in the first frequency band, whereas a BEF 52 is added to the circuit C for extracting the high-frequency signal in the third frequency band.

By adding the LPF 51 and the BEF 52 in this manner, the first frequency band may be reduced in the higher harmonics including the doubled frequency wave and the tripled frequency wave, while the third frequency band may be reduced in the higher harmonics including the doubled frequency wave and the tripled frequency wave.

Figure 32:
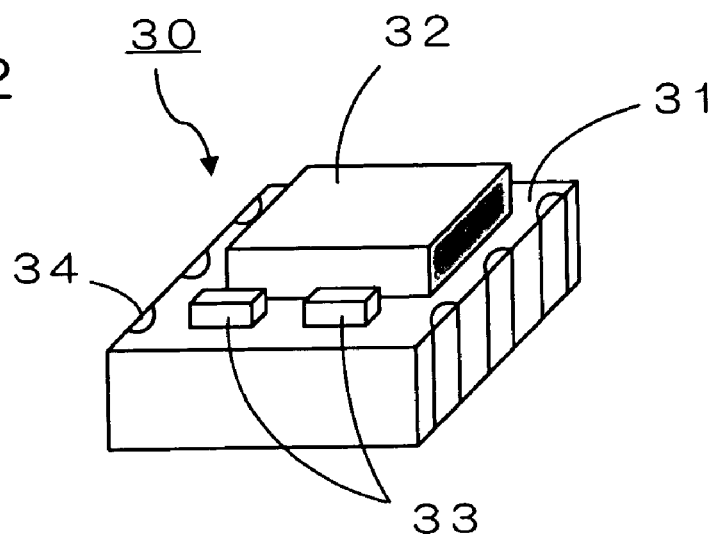
FIG. 32 is a perspective outside view showing a composite multiplexer chip component including the composite multiplexer circuit of the invention.

A composite multiplexer chip component 30 according to the above circuit configuration of the invention is shown in a perspective outside view of FIG. 32.

As shown in the figure, the composite multiplexer chip component 30 comprises a dielectric multilayered substrate 31, and a SAW filter chip 32 and a matching network 6 which are mounted on the substrate. The matching network 6 comprises a chip LC component 33, and strip lines, an inductor and a capacitor which are formed within the dielectric multilayered substrate 31 formed by laminating a plurality of dielectric layers.

Each of the dielectric layers may be formed as follows, for example. Using a conductive material such as copper foil, a conductor pattern is formed on an organic dielectric substrate such as of a glass epoxy resin. The resultant organic dielectric layers are laminated and then are thermally cured. In an alternative method, inorganic dielectric layers such as of a ceramic material are formed with various conductor patterns and are concurrently laminated and sintered.

The use of the ceramic material, in particular, provides a thinner dielectric layer because the ceramic dielectric material normally has a dielectric constant of 9 to 25, which is higher than that of the resin substrate. Therefore, the circuit devices incorporated in the dielectric layers may be downsized and besides, a distance between the devices may also be decreased.

It is particularly preferred to use a ceramic material such as glass ceramics which can be sintered at low temperatures. This is because such a ceramic material permits the conductor pattern to be formed from a material having low resistances, such as copper, silver or the like.

Each of the dielectric layers is vertically formed with a via-hole conductor necessary for vertical connection of the circuits, the via-hole conductor extended through plural dielectric layers. The via-hole conductor may be formed by plating a metal on an inside surface of a through-hole extended through the dielectric layers or filling a conductive paste in the through-hole.

As shown in FIG. 32, electrodes 34 for connecting the conductor pattern with the externals are provided at an end face or a back side of the dielectric multilayered substrate 31 formed as described above. Thus is completed the composite multiplexer chip component 30 including the composite multiplexer circuit.

Figure 33:
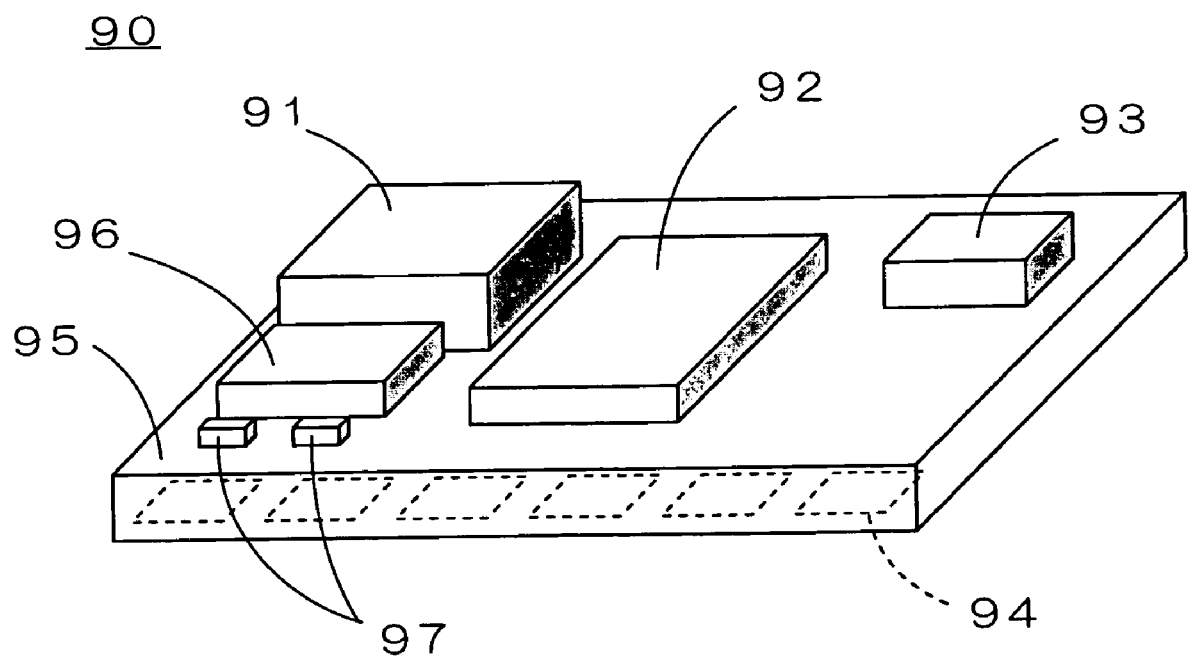
FIG. 33 is a perspective outside view showing a composite high-frequency module incorporating therein the composite multiplexer circuit of the invention.
Figure 34:
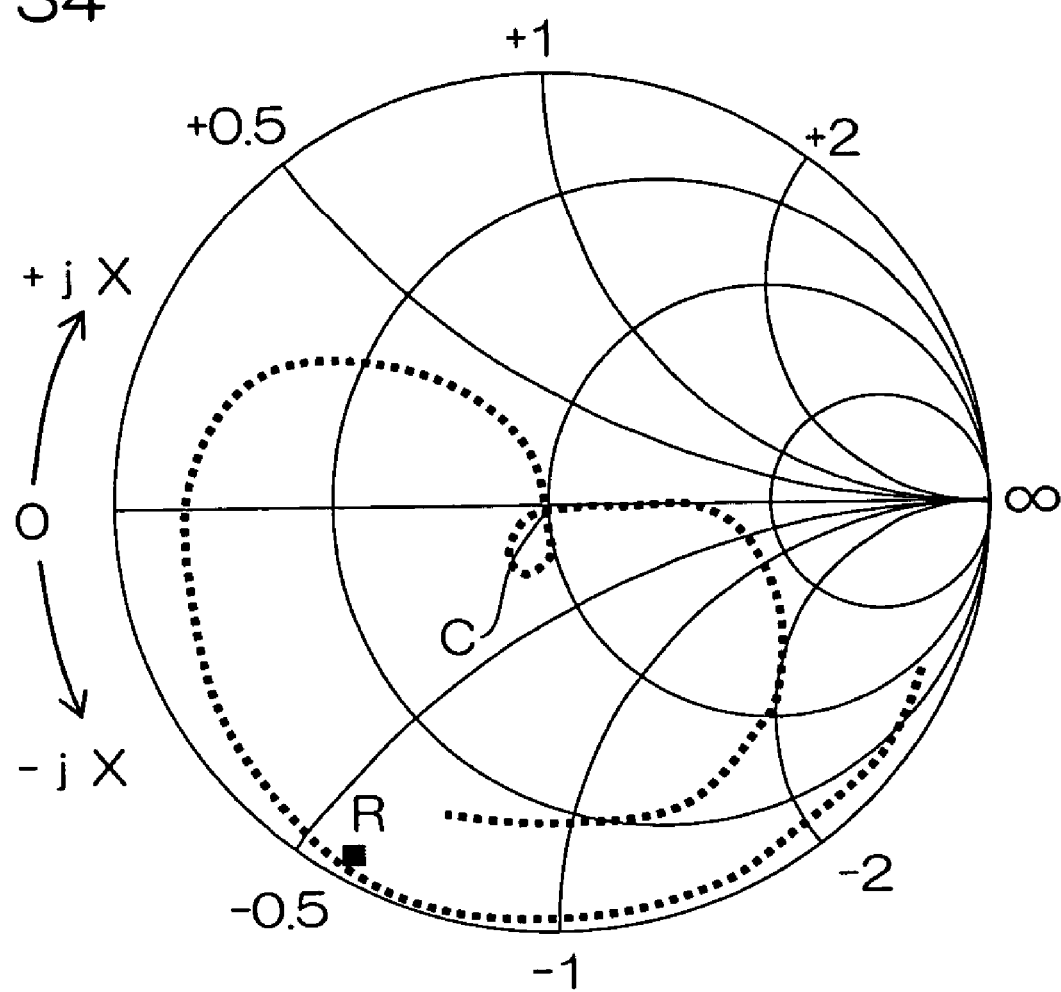
FIG. 34 is an impedance chart showing an input impedance of a single SAW filter.

FIG. 33 is a perspective outside view showing a composite high-frequency module incorporating therein the composite multiplexer circuit of the invention.

A multilayered circuit board 95 of the module mounts thereon passive and active devices including a SAW filter 96 and a chip LC component 97 which form the composite multiplexer circuit, and also mounts thereon a SAW duplexer 91, a power amplifier 92, a SAW band pass filter 93 and the like. A part or the whole body of an inductor or a capacitor constituting a matching circuit between the individual components is integrated/formed in the multilayered circuit board 95.

In FIG. 33, a plurality of terminal electrodes 94 are formed on a back side of the multilayered circuit board 95. The terminal electrodes 94 include ones which function as input/output terminals of the composite multiplexer circuit and the composite high-frequency module.

Such a high-frequency module 90 may be used in radio communication apparatuses such as a multiband mobile radio terminal.

While the embodiments of the invention have been fully described, it is noted that the practice of the invention is not limited to the foregoing embodiments. For instance, a parallel phase matching inductor may be installed between the antenna terminal and the ground in FIGS. 6, 7, 12, 13, 14, 20, 21, 22, 26, 27 or 31. However, where such inductor is installed, a useless low frequency notch may be generated in the circuit including the SAW filter. If such low frequency notch is generated, it is preferable not to install the parallel phase matching inductor. While the Cellular, PCS and GPS are illustrated as the communication systems of the individual transmission/reception systems, these are mere examples of the communication system/frequency band. The invention is applicable to any of the frequency bands of the GSM, GPS, DCS (Digital Cellular System), Cellular, PCS, W-CDMA and the like.

The invention claimed is:

1. A composite multiplexer circuit for multiplexing a plurality of frequency bands, comprising
a plurality of multiplexer circuits connected in parallel
at least one of multiplexer circuits for extracting one frequency band having a matching network including an inductor and a capacitor, and a surface acoustic wave filter connected in series with the matching network, wherein
in an individual frequency band of the plurality of frequency bands, a total sum of real parts of admittances normalized by a characteristic admittance, as view from a junction point connected with an antenna terminal to all the multiplexer circuits, is 1 whereas the total sum of imaginary parts of the admittances is 0.

2. A composite multiplexer circuit according to claim 1, wherein the plural frequency bands include a first frequency band, and a second frequency band higher than the fist frequency band, and wherein the multiplexer circuits include a first multiplexer circuit for extracting the first frequency band, and a second multiplexer circuit for extracting the second frequency band, and respective admittance in the first frequency band and the second frequency band in the first multiplexer circuit are express as:

$Y1a=G1a+jB1a,$ $Y2a=G2a+jB2a,$ whereas respective admittance in the first frequency band and the second frequency band in the second multiplexer circuit are expressed as:

$Y1b=G1b+jB1b,$ $Y2b=G2b+jB2b,$ (where "j" represents an imaginary unit, "1" and "2" represent frequency bands, "Y" represents admittance, "G" represents real part, and "B" represents imaginary part), and wherein the composite multiplexer circuits are designed to satisfy the following expressions:

$Gna+Gnb=1$ $Bna+Bnb=0(n1, 2).$

3. A composite multiplexer circuit according to claim 2, wherein the first multiplexer circuit is a circuit including a low pass filter, and
wherein the second multiplexer circuit comprises the matching network and the surface acoustic wave filter.

4. A composite multiplexer circuit according to claim 3, wherein the first multiplexer circuit comprises the matching network and the surface acoustic wave filter, whereas the second multiplexer circuit is a circuit including a high pass filter.

5. A composite multiplexer circuit according to claim 1, wherein the plural frequency bands include a first frequency band, a second frequency band higher than the first frequency band, and a third frequency band higher than the second frequency band, and
wherein the multiplexer circuits include a first multiplexer circuit for extracting the first frequency band, a second multiplexer circuit for extracting the second frequency band, and a third multiplexer circuit for extracting the third frequency band, and
respective admittance in the first frequency band, the second frequency band, and the third frequency band in the first multiplexer circuit are express as:

$Y1a=G1a+jB1a,$ $Y2a=G2a+jB2a,$ $Y3a=G3a+jB2a,$ respective admittance in the first frequency band, the second frequency band, and the third frequency band in the second multiplexer circuit are expressed as:

$Y1b=G1b+jB1b,$ $Y2b=G2b+jB2b,$ $Y3b=G3a+jB3b,$ and respective admittance in the first frequency band, the second frequency band, and the third frequency band in the third multiplexer circuit are expressed as:

$Y1c=G1c+jB1c,$ $Y2c=G2c+jB2c,$ $Y3c=G3c+jB3c,$ (where "j" represents an imaginary unit. "1," "2," and "3" represent frequency bands, "Y" represents admittance. "G" represents real part, and "B" represents imaginary part).

and wherein the composite multiplexer circuits are designed to satisfy the following expressions:

$Gna+Gnb+Gnc=1$ $Bna+Bnb+Bnc=0(n=1, 2,3).$

6. A composite multiplexer circuit according to claim 5, wherein the second multiplexer circuit comprises the matching network and the surface acoustic wave filter.

7. A composite multiplexer circuit according to claim 6, wherein the first multiplexer circuit is a circuit including a low pass filter, whereas the third multiplexer circuit is a circuit including a high pass filter.

8. A composite multiplexer circuit according to claim 1, wherein the matching network comprises a series capacitor, a parallel capacitor, a series inductor and a parallel capacitor, which are arranged from an input side in the order named.

9. A composite multiplexer circuit according to claim 8, wherein the series inductor of the matching network has an Inductance L of 15 nH or less, and a Q of 15 or more as determined at 800MHz.

10. A composite multiplexer circuit according to claim 1, wherein the SAW filter is of a Balance output type or of an Unbalance output type.

11. A chip component comprising a dielectric multilayered substrate mounting thereon the individual multiplexer circuits included in the composite multiplexer circuit according to claim 1.

12. A high-frequency module comprising the composite multiplexer circuit according to claim 1 mounted on a surface of and/or internally of a dielectric multilayered substrate, and mounting thereon either one or both of a duplexer and a power amplifier.

13. A radio communication apparatus comprising the high-frequency module according to claim 12.

14. A composite multiplexer circuit for multiplexing a plurality of frequency bands, comprising:
a plurality of multiplexer circuit connected in parallel,
wherein at least one of the multiplexer circuits for extracting one frequency band having a high pass filter including an inductor and a capacitor, and a band elimination filter, wherein
in an individual frequency band of the plurality of frequency bands, a total sum of real parts of admittances normalized by a characteristic admittance, as view from a junction point connected with an antenna terminal to all the multiplexer circuits, is 1 whereas the total sum of imaginary parts of the admittances is 0.

15. A composite multiplexer circuit according to claim 14, wherein the plural frequency bands include a first frequency band, a second frequency band higher than the first frequency band, and a third frequency band higher than the second frequency band, and
wherein the multiplexer circuits include a first multiplexer circuit for extracting the first frequency band, a second multiplexer circuit for extracting the second frequency band, and a third multiplexer circuit for extracting the third frequency band, respective admittance in the first frequency band, the second frequency band, and the third frequency band in the first multiplexer circuit are express as:

$$Y1d=G1d+jB1d,$$

$$Y2d=G2d+jB2d,$$

$$Y3d=G3d+jB2d,$$

respective admittance in the first frequency band, the second frequency band, and the third frequency band in the second multiplexer circuit are expressed as:

$$Y1e=G1e+jB1e,$$

$$Y2e=G2e+jB2e,$$

$$Y3e=G3e+jB3e, \text{ and}$$

respective admittance in the first frequency band, the second frequency band, and the third frequency in the third multiplexer circuit are expressed as:

$$Y1f=G1f+jB1f,$$

$$Y2f=G2f+jB2f,$$

$$Y3f=G3f+jB3f,$$

(where "j" represents an imaginary unit, "1," "2," and "3" represent frequency bands, "Y" represents admittance, "G" represents real part, and "B" represents imaginary part).

and wherein the composite multiplexer circuits are designed to satisfy the following expressions:

$$Gnd+Gne+Gnf=1$$

$$Bnd+Bne+Bnf=0(n=1, 2,3).$$

16. A composite multiplexer circuit according to claim 15, wherein the first multiplexer circuit comprises at least one low pass filter; the second multiplexer circuit comprises a high pass filter and a band elimination filter; and the third multiplexer circuit comprises a high pass filter.

* * * * *